US006977417B2

(12) United States Patent
Momiyama et al.

(10) Patent No.: US 6,977,417 B2
(45) Date of Patent: Dec. 20, 2005

(54) SEMICONDUCTOR DEVICE AND METHOD OF FABRICATING THE SAME

(75) Inventors: Youichi Momiyama, Kawasaki (JP); Kenichi Okabe, Kasugai (JP); Takashi Saiki, Kawasaki (JP); Hidenobu Fukutome, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/465,823

(22) Filed: Jun. 20, 2003

(65) Prior Publication Data

US 2004/0004250 A1 Jan. 8, 2004

(30) Foreign Application Priority Data

Jun. 24, 2002 (JP) ............................ 2002-183055
Dec. 6, 2002 (JP) ............................ 2002-355884
Jun. 13, 2003 (JP) ............................ 2003-168799

(51) Int. Cl.[7] ............................................ H01L 21/336
(52) U.S. Cl. ...................... 257/336; 257/335; 257/344; 257/371; 257/374; 257/408; 438/223; 438/207; 438/306
(58) Field of Search ................................ 257/324, 335, 257/336, 344, 371, 408; 428/306, 204, 227

(56) References Cited

U.S. PATENT DOCUMENTS 6,159,856 A * 12/2000 Nagano ...................... 438/683
6,297,114 B1 * 10/2001 Iwata et al. ................. 438/305
6,440,802 B1 * 8/2002 Hayashi et al. ............. 438/275

FOREIGN PATENT DOCUMENTS

JP 10-209265 * 8/1998 ........... H01L 21/76

* cited by examiner

*Primary Examiner*—Nathan J. Flynn
*Assistant Examiner*—Fazli Erdem
(74) *Attorney, Agent, or Firm*—Westerman, Hattori, Daniels & Adrian, LLP

(57) ABSTRACT

An impurity-diffused layer having an extension structure is formed first by implanting Sb ion as an impurity for forming a pocket region; then by implanting N as a diffusion-suppressive substance so as to produce two peaks in the vicinity of the interface with a gate electrode and at an amorphous/crystal interface which serves as an defect interface generated by the impurity in the pocket region; and by carrying out ion implantations for forming an extension region and deep source and drain regions.

7 Claims, 18 Drawing Sheets

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application Nos. 2002-183055, filed on Jun. 24, 2002, 2002-355884, filed on Dec. 6, 2002 and 2003-168799, filed on Jun. 13, 2003, the entire contents of which are incorporated herein by reference.

BACKGROUND OF THE INVENTION

1. Field of the Invention

This invention relates to a semiconductor device having an extension structure and a method of fabricating thereof, which are particularly preferable as being applied to CMOS-structured semiconductor device.

2. Description of the Related Art

Many conventional MOS transistors employ LDD structure in order to suppress short channel effect and to improve hot-carrier resistance.

On the other hand, a major stream towards higher shrinkage and higher integration has been shortening gate length of MOS transistors. Shortening of the gate length, however, tends to raise nonconformities such as time-dependent changes in the threshold voltage due to hot carriers and degradation of mutual conductance. As one solution for the problem, a MOS transistor having so-called extension structure (LDD structure) has been proposed. This MOS transistor has a pair of impurity-diffused layers which are fabricated by forming shallow extension layers, forming side walls or the like as being attached to a gate electrode, and then forming deeper source and drain regions so as to partially overlap the extension region.

Recent accelerated trends towards still higher shrinkage and still higher integration of MOS transistors have, however, raised two following problems in those having the extension structure.

(1) Control of concentration profile in the extension region adds importance in pursuit of further shrinkage of MOS transistors. In particular, lateral concentration profile in the extension region holds the key for raising current drivability. In this case, roll-off characteristic of the threshold voltage and the current drivability, that is, electric resistance of the extension region, are in a relation of tradeoff, which demands precise adjustment of the both as described below.

To improve roll-off characteristic of the threshold voltage, it is preferable to ensure a metallurgical effective gate length as long as possible with respect to a given physical gate length. This successfully lowers impurity concentration of the channel, which raises mobility of carriers since they become less likely to be scattered by the impurity, and consequently improves current drivability of the MOS transistor. If the metallurgical gate length is kept constant, the physical gate length can be reduced.

On the other hand, the extension region should overlap the gate electrode to a sufficient degree. Since carrier density in an inverted layer under strong inversion condition could reach as high as an order of $10^{19}/cm^3$, a portion of the extension region just under the edge of the gate electrode, that is, end portion of the extension region, may function as an electric resistor and may thus degrade the current drivability. To suppress such nonconformities, it is necessary to raise impurity concentration at the end portion to at least as high as $5\times10^{19}/cm^3$.

To form the extension region having thus-controlled impurity concentration, it is necessary to sharpen the lateral concentration profile in the extension region. More specifically, it is preferable to form a concentration profile ensuring an impurity concentration of $5\times10^{19}/cm^3$ or above for the end portion, and allowing it to sharply decrease from the end portion towards the channel. One ideal solution is to form the extension region in a so-called box shape. It is, however, extremely difficult to desirably control the sharpness in the profile since the lateral concentration profile is generally governed by diffusion phenomenon.

(2) Many of recent MOS transistors have a pocket region formed therein so as to surround the extension region by implanting impurity ion having a conductivity type opposite thereto, in order to further improve roll-off characteristic of the threshold voltage and current drivability. In a typical case of CMOS transistor, nMOS transistor uses indium (In) and pMOS transistor uses arsenic (As) or antimony (Sb) as the impurity to be contained in the pocket region, where all of which are relatively heavy elements.

These impurities are used because they are excellent in terms of upgrading the roll-off characteristic and current drivability. They are, however, heavy elements and thus causative of crystal defects when they are introduced by ion implantation, which defects cannot completely be removed even after annealing for activation, and tend to increase drain leakage, especially its component around the gate electrode. Since the pocket region is designed so as to be hidden behind deep source and drain regions, the gate peripheral thereof will remain almost constant. While annealing for clearing defects is known to be effective for suppressing the drain leakage current, the annealing also promotes diffusion of the impurities, which interferes shrinkage of the device.

As described in the above, an effort to further shrink the extension-structured MOS transistors undesirably makes it difficult to control the lateral concentration profile in the extension region, and an additional effort to form the pocket region aimed at improving roll-off characteristic of the threshold voltage and current drivability through reduction in drain leakage current undesirably makes it difficult to shrink the device, which is against the major purpose of the process.

SUMMARY OF THE INVENTION

The present invention is completed for solving the foregoing problems, and is to provide a semiconductor device and a method of fabricating thereof whereby shrinkage and higher integration of the device can be ensured in a simple and exact manner without ruining an effort to improve roll-off characteristic of the threshold voltage and current drivability and to reduce drain leakage current; and is in particular to provide a CMOS-structured semiconductor device and a method of fabricating thereof whereby optimum design of the device can be ensured so as to realize advanced performance and lowered power consumption.

The present inventors reached the following aspects of the invention after extensive investigations.

The semiconductor device of the present invention comprises a semiconductor substrate; a gate electrode formed on the semiconductor substrate while placing a gate insulating film in between; a pair of impurity-diffused layers formed in the surficial portion of the semiconductor substrate on both sides of the gate electrode; each of the impurity-diffused layers comprising a shallow first region partially overlapping the bottom portion of the gate electrode; a second region being deeper than the first region and overlapping the first region; and a third region having introduced therein a diffusion-suppressive substance for suppressing diffusion of an impurity contained in the first region so as to have concentration peaks at least at a first position in the vicinity of the interface with the semiconductor substrate and at a second position deeper than the first region.

The method of fabricating a semiconductor device of the present invention comprises a first step of forming a gate electrode on a semiconductor substrate while placing a gate insulating film in between; a second step of introducing at least one diffusion-suppressive substance for suppressing diffusion of a conductivity-providing impurity, which will be introduced later, into the surficial portion of the semiconductor substrate on both sides of the gate electrode; a third step of introducing the conductivity-providing impurity into the surficial portion of the semiconductor substrate on both sides of the gate electrode to a depth shallower than that for the diffusion-suppressive substance; a fourth step of forming an insulating film only on the side faces of the gate electrode; and a fifth step of introducing an impurity having a conductivity type same as that of conductivity-providing impurity introduced previously in the third step to a depth deeper than that of the diffusion-suppressive substance introduced previously in the second step; wherein the first step comes first, and the second through fifth steps follow thereafter in an arbitrary order.

DETAILED DESCRIPTION OF THE PREFERRED EMBODIMENTS

—Basic Concept of the Present Invention—

Figure 1A:
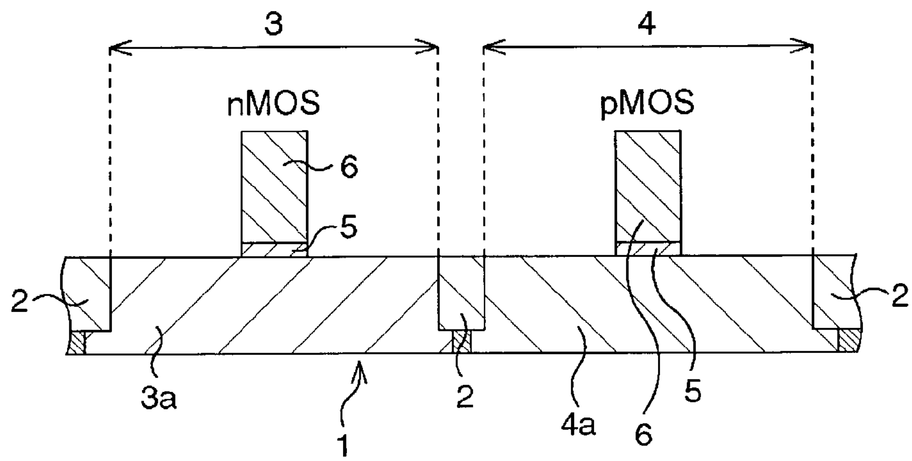
FIGS. 1A to 1C are schematic sectional views serially showing process steps of a method of fabricating a CMOS transistor according to a first embodiment.

First a basic concept of a major constitution of the present invention will be described.

After thorough consideration, the present inventors had a first idea on the extension-structured semiconductor device, having a shallow extension region (first region) and a source-and-drain region (second region) which is deeper than the first region and partially overlaps the first region, that impurity diffusion in the extension region, especially that proceeds in the lateral direction, must be suppressed in a simple and exact manner, and reached an optimum technique by which at least one diffusion-suppressive substance for suppressing diffusion of an impurity contained in the extension region is additionally introduced (formation of a third region).

When considering specific forms of introduction of such diffusion-suppressive substance, it is necessary to create a concentration peak in an extremely shallow portion of a semiconductor substrate, that is, in the vicinity of interface with a gate insulating film from the viewpoint of suppressing the foregoing lateral impurity diffusion.

There is another demand for reducing drain leakage current for the case where a pocket region (fourth region) is to be formed. While relatively heavy elements are preferably used as an impurity for forming the pocket region as described in the above, the heavy impurity is causative of defects through amorphization of the substrate. The present inventors thus had a second idea that the defects can be cleared if the diffusion-suppressive substance is segregated at the defect interface (end-of-range defect) produced by the impurity in the pocket region, that is, amorphous/crystal interface (A/C interface). In other words, the diffusion-suppressive substance is preferably introduced so as to locate another concentration peak at the A/C interface, and so as to have a concentration profile almost equivalent to that of the pocket region.

Thus in the present invention, the diffusion-suppressive substance is introduced so as to have concentration peaks at least two points, that is, in the vicinity of interface with the gate insulating film and at the A/C interface, and so as to have a concentration profile almost equivalent to that of the pocket region. Considering now that the area in the vicinity of interface with the gate insulating film plays an important role in suppressing the diffusion, it is particularly preferable to set the peak concentration at this portion higher than that at the A/C interface.

Introduction of the diffusion-suppressive substance in the above-described manner can successfully suppress lateral impurity diffusion so as to improve the roll-off characteristic, and improved sharpness in the concentration profile will successfully prevent resistivity at the end portion of the extension region from being increased, which results in improved current drivability. The introduction of the diffusion-suppressive substance is also advantageous in that recovering defects at the A/C interface caused by introduction of impurity into the pocket region, which successfully suppresses junction leakage (inter-band tunneling) ascribable to such defects, and results in a distinct decrease in drain leakage current.

The diffusion-suppressive substance available herein is selected from those having a relatively small mass and being inert to other elements composing the semiconductor substrate and various conductive impurities. N or $N_2$ are most preferable examples thereof, where any one selected from argon (Ar), fluorine (F) and carbon (C) is also allowable.

It is to be noted now that a technology simply introducing nitrogen into a substrate has already been proposed although the purpose and constitution thereof are different from those in the present invention.

—Specific Embodiments—

Based on the basic concept of the present invention described in the above, specific embodiments will be explained. The following paragraphs exemplify a CMOS transistor as a semiconductor device, and therefore deal with constitutions thereof together with methods of fabricating thereof. It is to be noted that the present invention is by no means limited to CMOS transistor, but is applicable to any semiconductor devices based on transistor structure having a gate, source and drain.

(First Embodiment)

FIGS. 1A through 4C are schematic sectional views serially showing process steps of a method of fabricating a CMOS transistor according to the first embodiment.

First as shown in FIG. 1A, element active regions and gate electrodes are formed according to general CMOS processes.

More specifically, according to STI (shallow trench isolation) process, trenches are formed by photolithography and dry etching in a semiconductor substrate 1 in the areas planned for forming element isolation region, a silicon oxide film is deposited typically by CVD process so as to fill the trenches, and the silicon oxide film is removed by CMP (chemical mechanical polishing) from the top so as to allow it to remain only in the trenches, to thereby form STI-type element isolation structure 2 and partition an n-type element active region 3 and a p-type element active region 4. Next, a p-type impurity and an n-type impurity are introduced by ion implantation into the n-type element active region 3 and p-type element active region 4, respectively, to thereby form a p-well 3*a* and an n-well 4*a*, respectively. In this example, the n-type element active region 3 serves as an area for forming an nMOS transistor, and the p-type element active region 4 serves as an area for forming a pMOS transistor.

Next, a gate insulating film 5 is formed by thermal oxidation over the element active regions 3, 4, a polysilicon film is then deposited thereon typically by CVD process, and the polysilicon film and gate insulating film 5 are then patterned in a form of electrode by photolithography and dry etching to thereby form gate electrodes 6 respectively in the element active regions 3, 4 while being underlain by the gate insulating film 5.

Figure 1B:
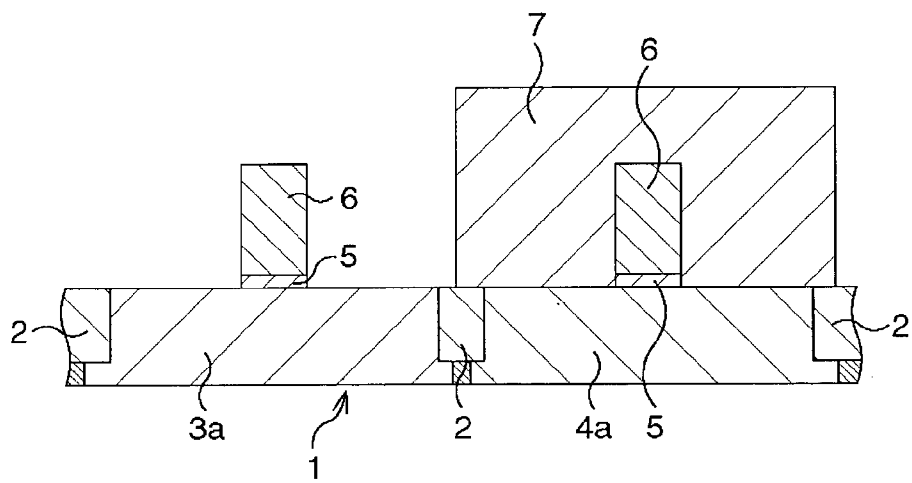

Next, a photoresist is coated on the entire surface, and is then processed by photolithography to thereby form a resist mask 7 exposing only the n-type element active region 3 as shown in FIG. 1B.

Only the n-type element active region 3 is then subjected to ion implantation for forming a pair of pocket regions.

Figure 1C:
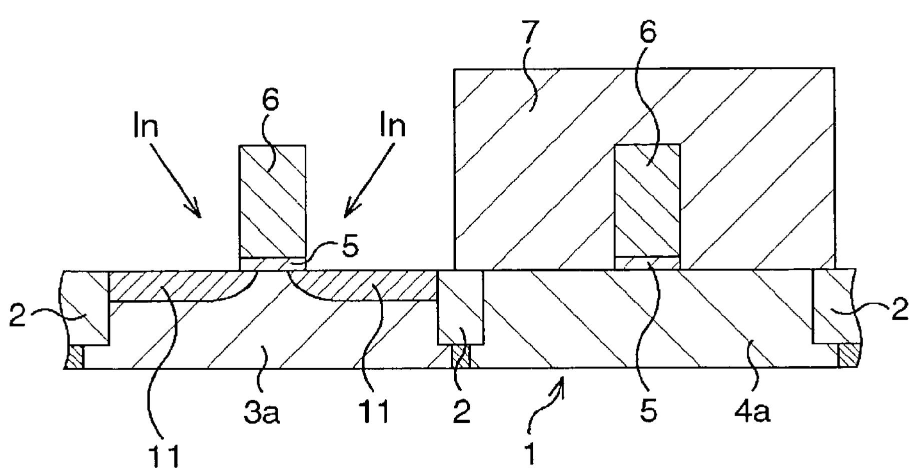

More specifically, as shown in FIG. 1C, a p-type impurity ion, which are indium (In) ion herein for example, was implanted in the n-type element active region 3 exposed out from the resist mask 7 under masking by the gate electrode 6, to thereby form a pair of pocket regions 11 in the surficial portion of the semiconductor substrate 1 on both sides of the gate electrode 6.

Conditions for the ion implantation of In relates to an ion acceleration energy of 30 keV to 100 keV, and a dose of $5\times10^{12}/cm^2$ to $2\times10^{13}/cm^2$, where the ion is implanted along a direction inclined away from the normal line to the semiconductor substrate 1. Angle of the inclination (tilt angle) is set to 0° to 45°, where 0° represents the direction of the normal line to the semiconductor substrate 1. In this embodiment, the ion is implanted into the surficial portion of the substrate in the foregoing ion acceleration energy and dose from four directions symmetrical with each other. It is to be noted now that all implantations employing the tilt angle are always carried out along four directions although not specifically noted hereinafter. It is also allowable to use boron (B) in place of In, where the ion acceleration energy is set to 3 keV to 10 keV.

Next, nitrogen (N) is introduced as a diffusion-suppressive substance.

Figure 2A:
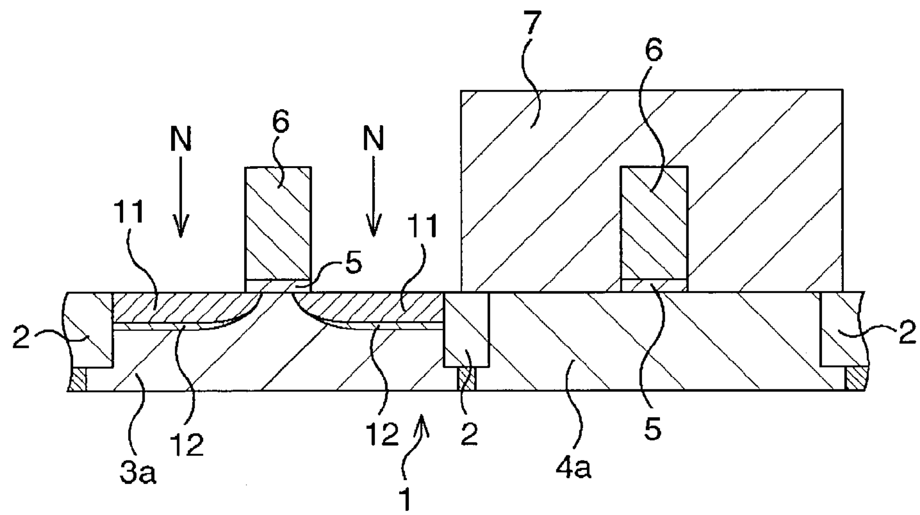
FIGS. 2A to 2C are schematic sectional views serially showing process steps as continued from FIG. 1C.

More specifically, as shown in FIG. 2A, a diffusion-suppressive substance, which is N herein for example, is implanted in the n-type element active region 3 exposed out from the resist mask 7 under masking by the gate electrode 6, to thereby form a pair of N-diffused regions 12 in the surficial portion of the semiconductor substrate 1 on both sides of the gate electrode 6 so as to approximately overlap the pocket regions 11. Conditions for the ion implantation relates to an ion acceleration energy of 5 keV to 10 keV (an ion acceleration energy of 0.5 KeV to 20 KeV may be allowable), a dose of $1\times10^{14}/cm^2$ to $2\times10^{15}/cm^2$, and a tilt angle of 0° to 10° (a tilt angle of 0° to 30° may be allowable). Diffusion-suppressive effect increases as the dose of N is increased from $1\times10^{14}/cm^2$, and shows a saturating tendency at $2\times10^{15}/cm^2$ or above. It is also allowable to use $N_2$ in place of single N, since it is relatively difficult for single N to ensure a sufficient level of implantation beam current. The ion acceleration energy and dose for $N_2$ are preferably halved of those for single N. It is still also allowable to use at least one substance selected from Ar, F and C in place of N or $N_2$.

The next step relates to ion implantation for forming the extension region.

Figure 2B:
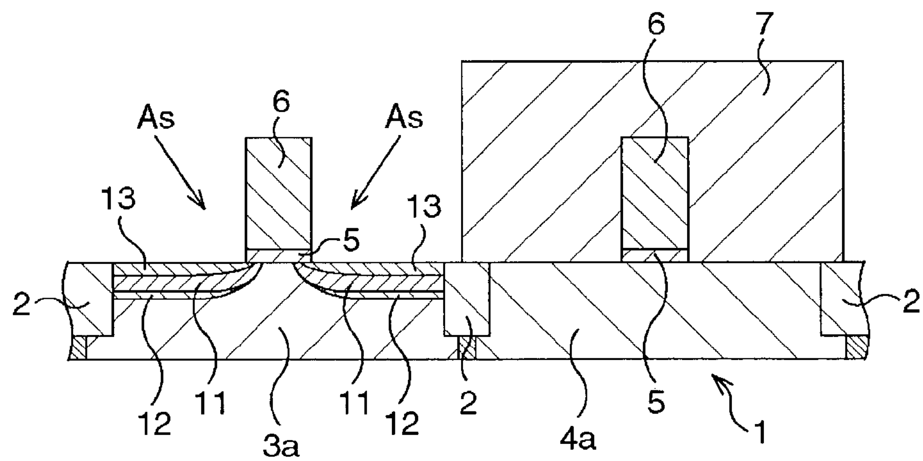

More specifically, as shown in FIG. 2B, an n-type impurity ion, which is arsenic (As) ion herein for example, is implanted in the n-type element active region 3 exposed out from the resist mask 7 under masking by the gate electrode 6, to thereby form a pair of extension regions 13 in the surficial portion of the semiconductor substrate 1 on both sides of the gate electrode 6. It is also preferable to use phosphorus (P) or antimony (Sb) in place of As. Conditions for the ion implantation relates to an ion acceleration energy of 1 keV to 5 keV (an ion acceleration energy of 0.5 KeV to 10 KeV may be allowable), a dose of $1\times10^{14}/cm^2$ to $2\times10^{15}/cm^2$, and a tilt angle of 0° to 10° (a tilt angle of 0° to 30° may be allowable).

Figure 2C:
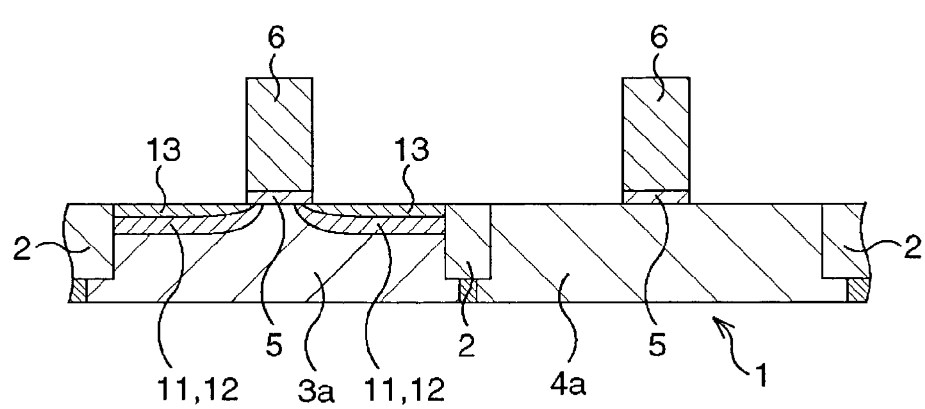

Next as shown in FIG. 2C, the resist mask 7 is removed typically by ashing, and annealing is carried out. Conditions for the annealing are at 900° C. to 1,025° C., for an extremely short time as close as 0 second in an inert atmosphere such as nitrogen atmosphere. This allows concentration profile of the implanted N to change from its as-implanted status, and a concentration profile finally achieved will be such that approximately overlapping the pocket region 11, and that having two concentration peaks in the vicinity of an interface with the semiconductor substrate 1 and at the A/C interface. It is to be noted that the annealing in this stage is based on a special consideration on raising electrical activity of In implanted for forming the pocket region 11, but is omissible if heat treatment or any thermal process in the later stage is properly adjusted.

Figure 5:
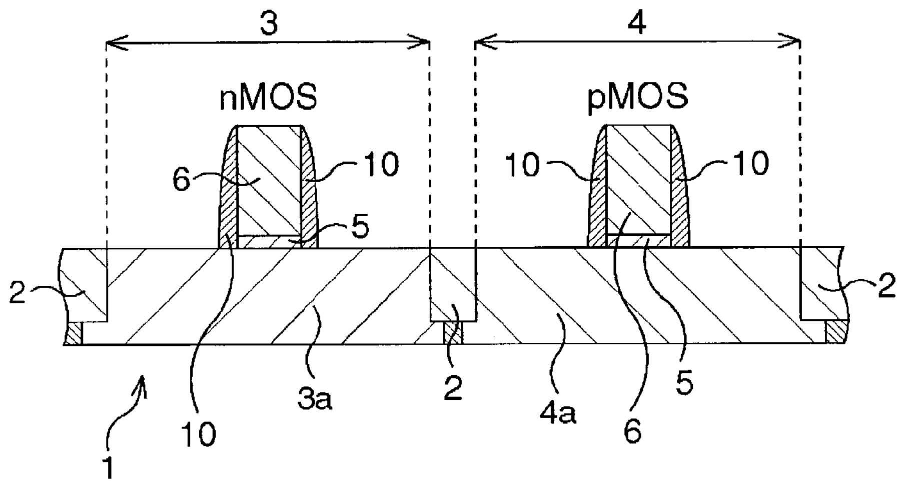
FIG. 5 is a schematic sectional view showing a modified example of the first embodiment, in which sidewalls are formed on both side faces of the gate electrode.

Although the above description dealt with the case where the individual ion implantations were carried out under masking by the gate electrode 6 having no sidewalls formed on the side faces thereof, it is also allowable, as shown in FIG. 5, to carry out the above ion implantations under masking by the gate electrode 6 having on both side faces thereof thin sidewalls 10 of approx. 5 nm to 20 nm thick in order to optimize the overlap between the extension region and gate electrode 6. It is still also allowable to form the sidewall on only either of the gate electrodes 6 in the element activation regions 3, 4. There are no special limitations on film constitution and shape of the sidewall so far as it can properly function as a spacer (mask).

The diffusion-suppressive effect is enhanced as the dose of N increases from $1\times10^{14}/cm^2$, and shows a saturating tendency at $2\times10^{15}/cm^2$ or above as described in the above, where optimum conditions therefor will vary depending on the presence or absence of the sidewall and the thickness thereof. Under the presence of the sidewall, the ion implantation must be optimized so as to raise the energy for forming the pocket region, and so as to raise the dose to a certain extent for forming the extension region.

While the implantation of the diffusion-suppressive substance was carried out after the resist mask 7 was formed in the process described in the present embodiment, the implantation may precede formation of the resist mask 7 while targeting the entire area of the element active regions 3, 4. The implantation following the formation of the resist mask 7 as described in the present embodiment is, however, advantageous since conditions for the implantation can be optimized independently for the nMOS and pMOS transistors.

Figure 3A:
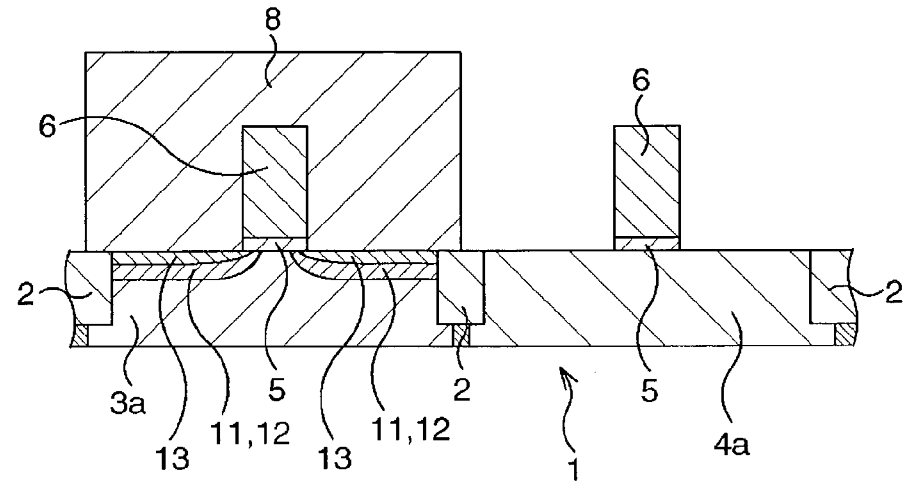
FIGS. 3A to 3C are schematic sectional views serially showing process steps as continued from FIG. 2C.

Next, a photoresist is coated on the entire surface, and is then processed by photolithography to thereby form a resist mask 8 exposing, this time, only the p-type element active region 4 as shown in FIG. 3A.

First, ion implantation for forming the pocket region is carried out.

Figure 3B:
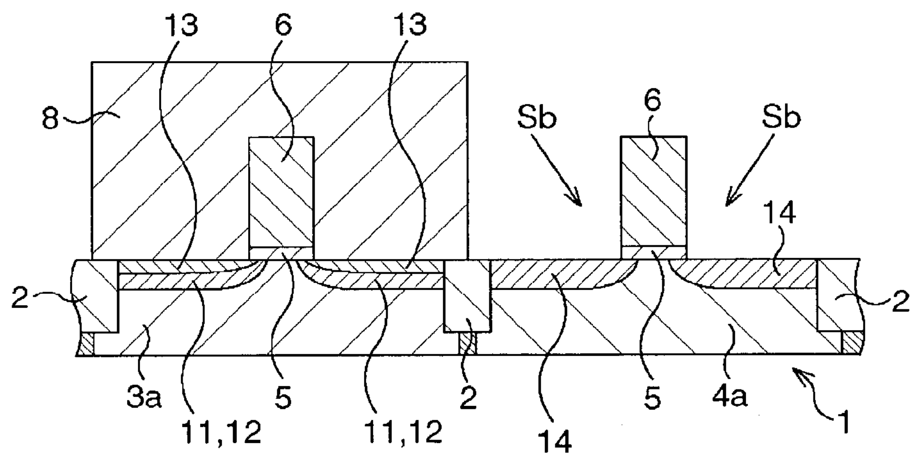

More specifically, as shown in FIG. 3B, an n-type impurity ion, which is antimony (Sb) ion herein for example, is implanted in the p-type element active region 4 exposed out from the resist mask 8 under masking by the gate electrode 6, to thereby form a pair of pocket regions 14 in the surficial portion of the semiconductor substrate 1 on both sides of the gate electrode 6.

Conditions for the ion implantation of Sb relates to an ion acceleration energy of 30 keV to 100 keV, a dose of $5\times10^{12}/cm^2$ to $2\times10^{13}/cm^2$, and a tilt angle of 0° to 45°. It is also allowable to use, in place of Sb, other n-type impurities such as As and P.

Next, nitrogen (N) is introduced as a diffusion-suppressive substance.

Figure 3C:
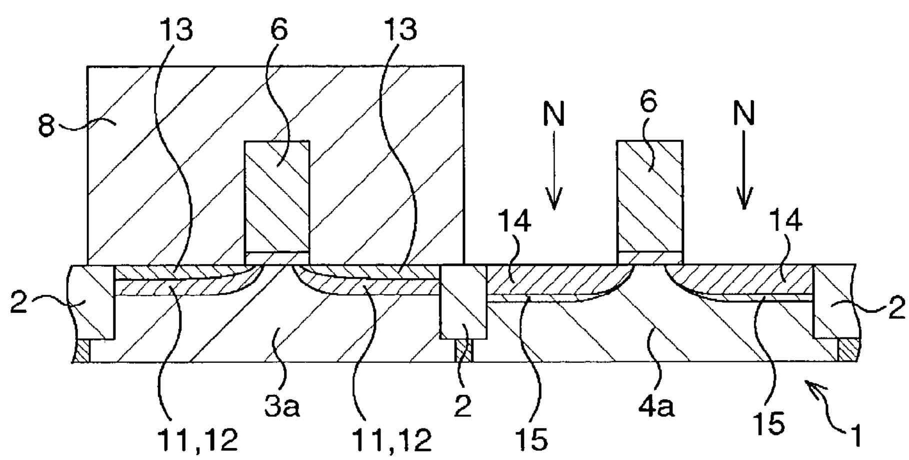

More specifically, as shown in FIG. 3C, a diffusion-suppressive substance, which is N herein for example, is implanted in the p-type element active region 4 exposed out from the resist mask 8 under masking by the gate electrode 6, to thereby form a pair of N-diffused regions 15 in the surficial portion of the semiconductor substrate 1 on both sides of the gate electrode 6 so as to approximately overlap the pocket regions 14. Conditions for the ion implantation relates to an ion acceleration energy of 5 keV to 10 keV (major conditions for ensuring close overlapping with the pocket regions 14), a dose of $1\times10^{14}/cm^2$ to $2\times10^{15}/cm^2$, and a tilt angle of 0° to 10°. It is also allowable to use $N_2$ in place of single N, since it is relatively difficult for single N to ensure a sufficient level of implantation beam current. The ion acceleration energy and dose for $N_2$ are preferably halved of those for single N. It is still also allowable to use at least one substance selected from Ar, F and C in place of N or $N_2$.

The next step relates to ion implantation for forming the extension region.

Figure 4A:
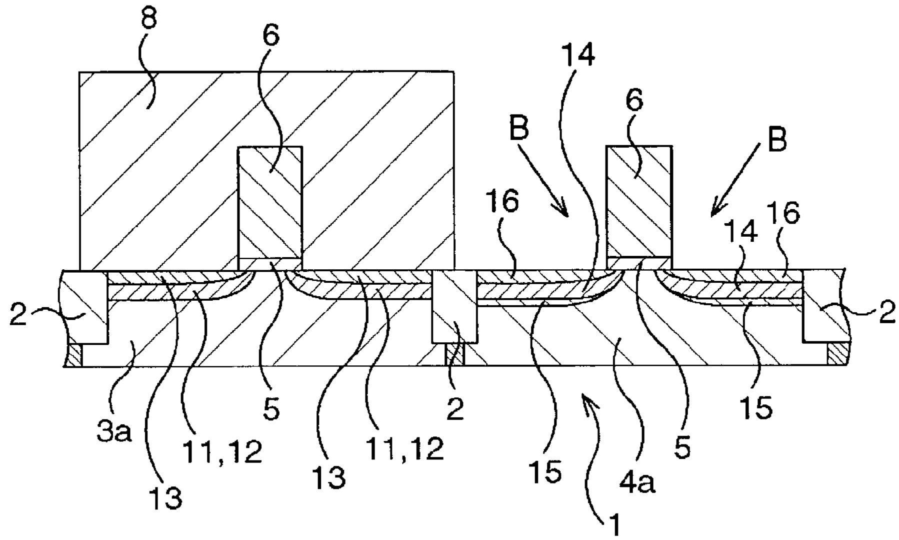
FIGS. 4A to 4C are schematic sectional views serially showing process steps as continued from FIG. 3C.

More specifically, as shown in FIG. 4A, a p-type impurity ion, which is boron (B) ion herein for example, is implanted in the p-type element active region 4 exposed out from the resist mask 8 under masking by the gate electrode 6, to thereby form a pair of extension regions 16 in the surficial portion of the semiconductor substrate 1 on both sides of the gate electrode 6.

Conditions for the ion implantation of B relate to an ion acceleration energy of 0.5 keV or below (an ion acceleration energy of 1 KeV or below may be allowable), a dose of $1\times10^{14}/cm^2$ to $2\times10^{15}/cm^2$, and a tilt angle of 0° to 10° (a tilt angle of 0° to 30° may be allowable). For the case where an ion species of $BF_2$ is used, the implantation can be optimized by setting the ion acceleration energy to 2.5 keV or below while the dose is remained unchanged. The optimum conditions will vary depending on the presence or absence of the sidewall and the thickness thereof. Under the presence of the sidewall, the ion implantation must be optimized so as to raise the energy for forming the pocket region, and so as to raise the dose to a certain extent for forming the extension region.

Next, a pair of deep source and drain regions (deep S/D regions) are formed respectively in the element active regions 3, 4.

Figure 4B:
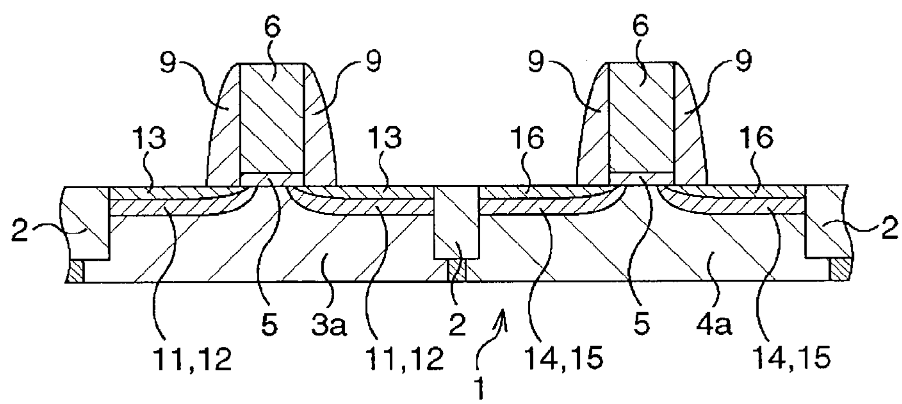

More specifically, the resist mask 8 is removed typically by ashing, a silicon oxide film is deposited typically by CVD process over the entire surface, and the silicon oxide film is then anisotropically etched (etched back) from the top so as to allow it to remain only on the side faces of the gate electrode 6, to thereby form sidewalls 9 as shown in FIG. 4B.

Figure 4C:
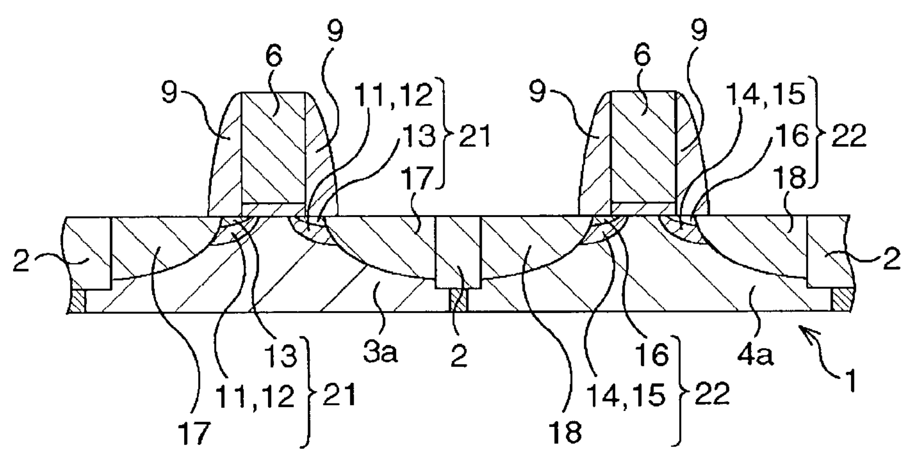

Next, a photoresist is coated on the entire surface, and is then processed by photolithography to thereby form a resist mask (not shown) exposing only the n-type element active region 3. Then an n-type impurity ion, which is phosphorus (P) ion herein for example, is implanted in the n-type element active region 3 exposed out from the resist mask under masking by the gate electrode 6 and sidewall 9 to thereby form a pair of deep S/D regions 17 in the surficial portion of the semiconductor substrate 1 on both sides of the gate electrode 6 as shown in FIG. 4C. Conditions for the ion implantation of P relate to an ion acceleration energy of 5 keV to 20 keV (an ion acceleration energy of 1 keV to 20 keV may be allowable), a dose of $2\times10^{15}/cm^2$ to $1\times10^{16}/cm^2$ (a dose of $2\times10^{15}/cm^2$ to $2\times10^{16}/cm^2$ may be allowable) and a tilt angle of 0° to 10° (a tilt angle of 0° to 30° may be allowable). It is also allowable to use arsenic (As) in place of P.

The resist mask is then removed typically by ashing, a new photoresist is again coated on the entire surface, and is then processed by photolithography to thereby form another resist mask (not shown) exposing, this time, only the p-type element active region 4. Then a p-type impurity ion, which is boron (B) ion herein for example, is implanted in the p-type element active region 4 exposed out from the resist mask under masking by the gate electrode 6 and sidewall 9 to thereby form a pair of deep S/D regions 18 in the surficial portion of the semiconductor substrate 1 on both sides of the gate electrode 6. Conditions for the ion implantation of B relate to an ion acceleration energy of 2 keV to 5 keV, a dose of $2\times10^{15}/cm^2$ to $1\times10^{16}/cm^2$, and a tilt angle of 0° to 10°. Any ions containing B, such as $BF_2$, are available for the ion implantation.

The individual impurities are then activated by rapid thermal annealing (RTA) at 1,000° C. to 1,050° C. instantaneously as close as 0 second (RTA at 900° C. to 1,100° C. within 10 seconds may be allowable). By this annealing, a pair of n-type impurity-diffused layers 21 comprising the pocket region 11, N-diffused region 12, extension region 13 and deep S/D region 17 is formed in the n-type element active region 3, and a pair of p-type impurity-diffused layers 22 comprising the pocket region 14, N-diffused layer 15, extension region 16 and deep S/D region 18 is formed in the p-type element active region 4.

The annealing is further followed by individual formation processes of inter-layer insulating film, contact hole and various wirings, which completes an nMOS transistor in the n-type element active region 3, and a pMOS transistor in the p-type element active region 4.

Although the present embodiment described in the above dealt with the case where a pair of impurity-diffused layers, later completed as a source and a drain, were formed after the gate electrode was formed, the present invention is by no means limited thereto, and order of formation processes therefor may properly be altered.

In the present embodiment described in the above, the impurity-diffused layers 21, 22 were formed by carrying out the ion implantation for forming the pocket region, N implantation aimed at diffusion suppression, and ion implantation for forming the extension region in this order, the order of these processes is arbitrary and is not specifically limited. It is to be noted, however, that it is necessary to optimize the concentration profiles of the pocket region and/or extension region since some specific orders of the processes may affect the concentration profile due to effects of amorphization.

The next paragraphs will explain the SIMS concentration profiles obtained by the individual implantations in the present embodiment descried in the above.

Figure 6:
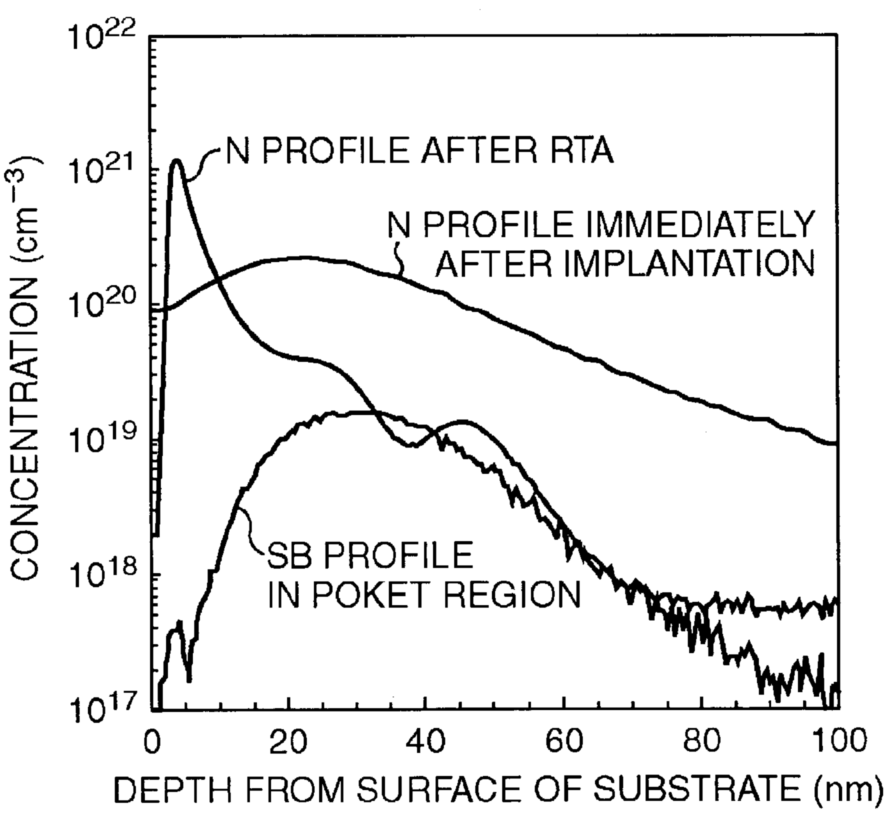
FIG. 6 is a characteristic chart showing SIMS concentration profiles of the individual implanted ions explained in the first embodiment.

FIG. 6 is a characteristic chart showing SIMS concentration profiles of the individual implanted ions explained in the above embodiment. The chart represents a case obtained after implanting Sb ion into the pocket region of the pMOS transistor, and shows a concentration profile of Sb, and those of N before and after the annealing. Similar concentration profiles are obtained also for the nMOS transistor.

As shown in the chart, the concentration profile of Sb remains almost unchanged even after the annealing (RTA) irrespective of presence or absence of N. On the other hand, the concentration profile of N changes after the annealing from the as-implanted profile so as to produce two concentration peaks in the vicinity of interface with the gate insulating film and in the vicinity of the A/C interface ascribable to the Sb implantation, which suggests segregation of N at these two points. With thus-produced N concentration profile, N segregated in the vicinity of interface with the gate insulating film suppresses diffusion of B to thereby successfully improve the roll-off characteristic and raise current drivability, and N segregated in the vicinity of the A/C interface successfully suppresses generation of the drain leakage current.

Next paragraphs will describe results of investigation on a relationship between minimum gate length and maximum drain current affected by N. The "minimum gate length" herein represents to what fineness the transistor can operate, and the "maximum drain current" herein represents an index describing a maximum drain current obtainable from the transistor having such fineness. It can therefore be understood that a transistor having shorter gate length and yielding larger maximum drain current has a better performance.

Figure 7:
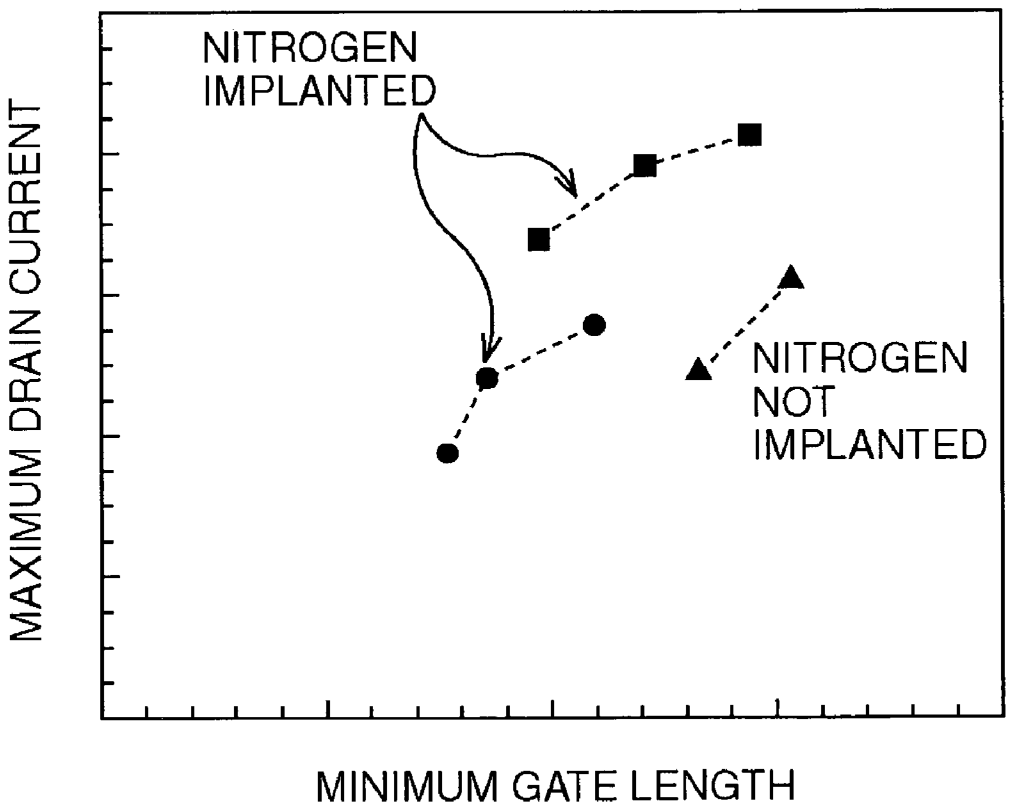
FIG. 7 is a characteristic chart showing relations between minimum gate length and maximum drain current depending on presence or absence of N implantation explained in the first embodiment.

FIG. 7 shows the relations, in which ▲ plot represents a conventional case without N implantation; and ● and ■ plots represent the cases with N implantation according to the present embodiment, where the ● plot corresponds with a case having a relatively low impurity concentration in the extension region, and the ■ plot having a relatively high impurity concentration therein. It was confirmed from the chart that the N implantation shifts the plot leftward or left-upward as a whole, indicating that the N implantation resulted in improvement in the performance. It was also found that raising the impurity concentration in the extension region ensures larger maximum drain current even if the minimum gate length is remained unchanged, which is advantageous for further improvement in the performance.

As has been described in the above, the present embodiment ensures shrinkage and higher integration of the semiconductor device in a simple and exact manner without ruining an effort to improve roll-off characteristic of the threshold voltage and current drivability and to reduce drain leakage current; and can particularly ensures optimum design of CMOS transistor so as to realize advanced performance and lowered power consumption.

(Second Embodiment)

In the second embodiment, a special consideration is made on formation of the pocket layer of an nMOS transistor in a CMOS transistor, whereby a diffusion-suppressive substance was introduced only to the nMOS transistor.

FIGS. 8A through 11C are schematic sectional views serially showing process steps of a method of fabricating a CMOS transistor according to the second embodiment.

Figure 8A:
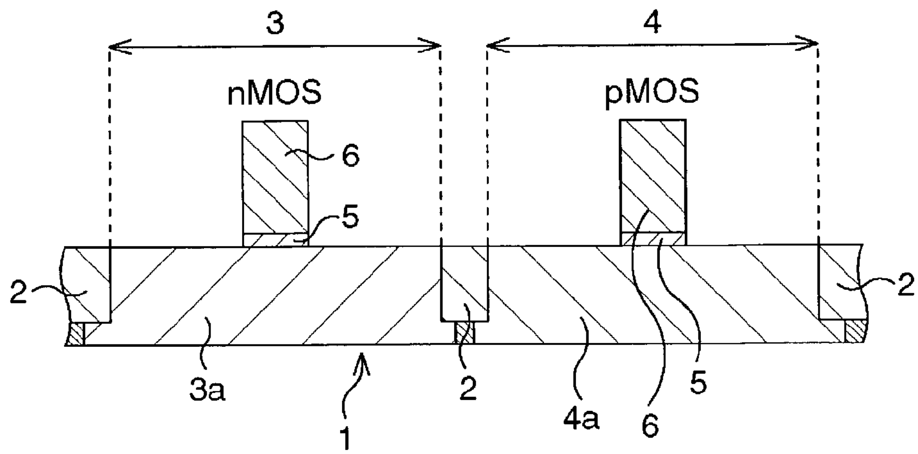
FIGS. 8A to 8C are schematic sectional views serially showing process steps of a method of fabricating a CMOS transistor according to a second embodiment.

First as shown in FIG. 8A, element active regions and gate electrodes are formed according to general CMOS processes.

More specifically, according to STI (shallow trench isolation) process, trenches are formed by photolithography and dry etching in a semiconductor substrate 1 in the areas planned for forming element isolation region, a silicon oxide film is deposited typically by CVD process so as to fill the trenches, and the silicon oxide film is removed by CMP (chemical mechanical polishing) from the top so as to allow it to remain only in the trenches, to thereby form STI-type element isolation structure 2 and partition an n-type element active region 3 and a p-type element active region 4. Next, a p-type impurity and an n-type impurity are introduced by ion implantation into the n-type element active region 3 and p-type element active region 4, respectively, to thereby form a p-well 3*a* and an n-well 4*a*, respectively. In this example, the n-type element active region 3 serves as an area for forming an nMOS transistor, and the p-type element active region 4 serves as an area for forming a pMOS transistor.

Next, a gate insulating film 5 is formed by thermal oxidation over the element active regions 3, 4, a polysilicon film is then deposited thereon typically by CVD process, and the polysilicon film and gate insulating film 5 are then patterned in a form of electrode by photolithography and dry etching to thereby form gate electrodes 6 respectively in the element active regions 3, 4 while being underlain by the gate insulating film 5. It is also allowable to form a silicon oxinitride film as the gate insulating film 5.

Figure 8B:
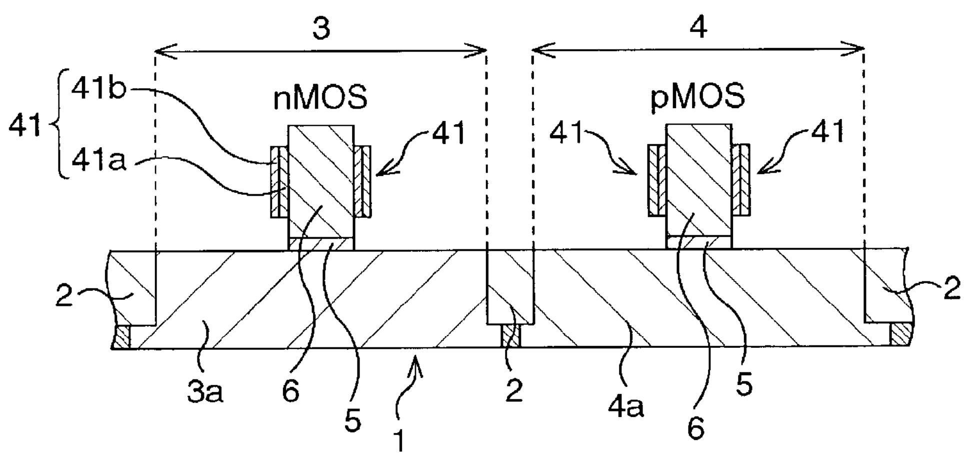

Next, in place of forming the thin sidewall 10 as previously shown in FIG. 5, notched spacers 41 as shown in FIG. 8B are formed in a self-aligned manner so as to cover only the central portion of the side faces of the gate electrodes 6, which spacers 41 are obtained by forming a silicon oxide film 41*a* and silicon nitride film 41*b* in this order so as to cover the gate electrodes 6, and then processing the films by anisotropic etching and wet etching.

Figure 8C:
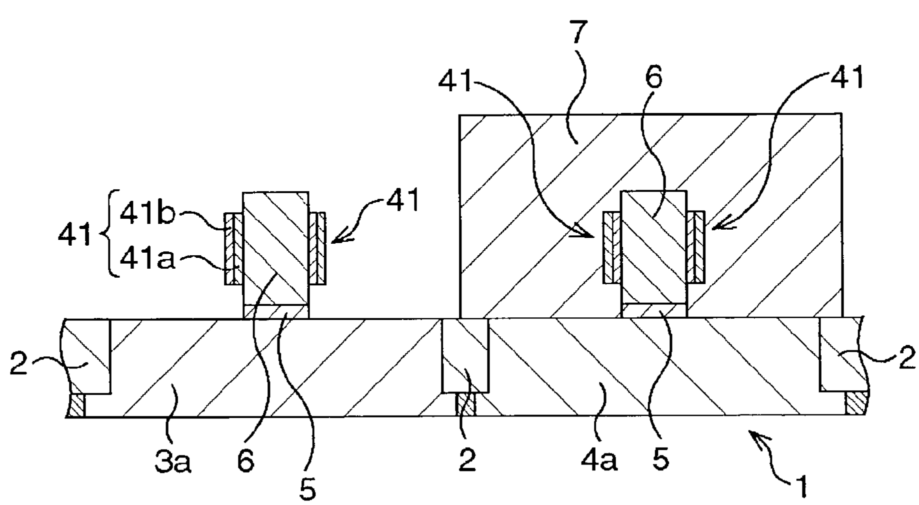

Next, a photoresist is coated on the entire surface, and is then processed by photolithography to thereby form a resist mask 7 exposing only the n-type element active region 3 as shown in FIG. 8C.

Only the n-type element active region 3 is then subjected to ion implantation for forming a pair of pocket regions.

Figure 9A:
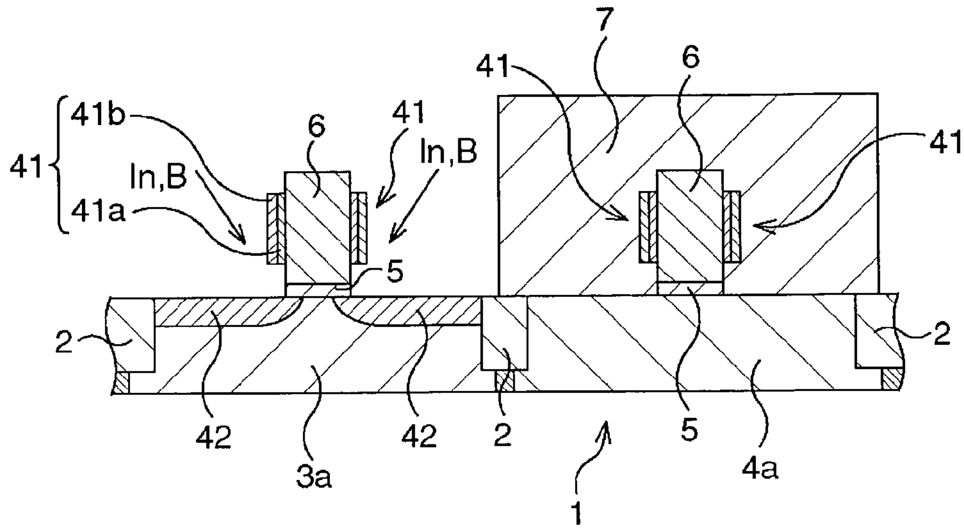
FIGS. 9A to 9C are schematic sectional views serially showing process steps as continued from FIG. 8C.

More specifically, as shown in FIG. 9A, p-type impurity ions, which are indium (In) and boron (B) ions herein for example, are respectively implanted in the n-type element active region 3 exposed out from the resist mask 7 under masking by the gate electrode 6, to thereby form a pair of pocket regions 42 in the surficial portion of the semiconductor substrate 1 on both sides of the gate electrode 6.

Conditions for the ion implantation of In relates to an ion acceleration energy of 30 keV to 100 keV, and a dose of $5\times10^{12}/cm^2$ to $2\times10^{13}/cm^2$, where the ion is implanted along a direction inclined away from the normal line to the semiconductor substrate 1. Angle of the inclination (tilt angle) is set to 0° to 45°, where 0° represents the direction of the normal line to the semiconductor substrate 1. In this embodiment, the ion is implanted into the surficial portion of the substrate in the foregoing ion acceleration energy and dose from four directions symmetrical with each other. It is to be noted now that all implantations employing the tilt angle are always carried out along four directions although not specifically noted hereinafter.

Conditions for the ion implantation of B relates to an ion acceleration energy of 3 keV to 10 keV, a dose of $5\times10^{12}/cm^2$ to $2\times10^{13}/cm^2$, and a tilt angle of 0° to 45°.

Next, nitrogen (N) is introduced as a diffusion-suppressive substance.

Figure 9B:
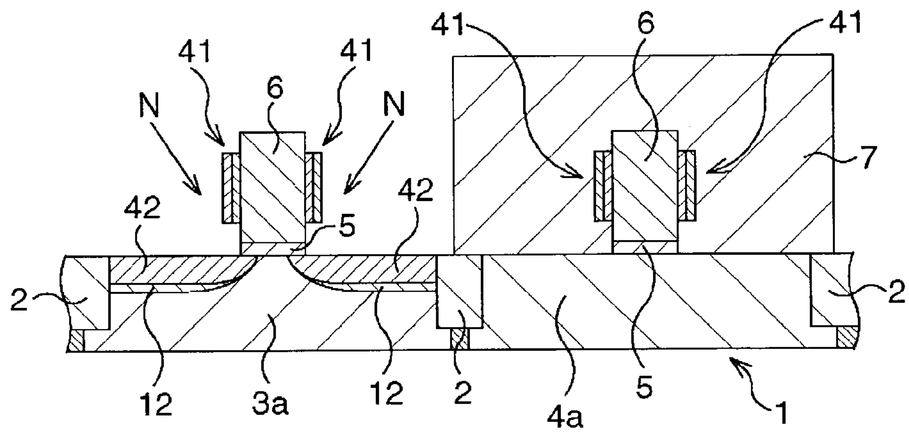

More specifically, as shown in FIG. 9B, a diffusion-suppressive substance, which is N herein for example, is implanted in the n-type element active region 3 exposed out from the resist mask 7 under masking by the gate electrode 6, to thereby form a pair of N-diffused regions 12 in the surficial portion of the semiconductor substrate 1 on both sides of the gate electrode 6 so as to approximately overlap the pocket regions 42. Conditions for the ion implantation relates to an ion acceleration energy of 5 keV to 10 keV, a dose of $1\times10^{14}/cm^2$ to $2\times10^{15}/cm^2$, and a tilt angle of 0° to 40°. Diffusion-suppressive effect increases as the dose of N increases from $1\times10^{14}/cm^2$, and shows a saturating tendency at $2\times10^{15}/cm^2$ or above. It is also allowable to use $N_2$ in place of single N, since it is relatively difficult for single N to ensure a sufficient level of implantation beam current. The ion acceleration energy and dose for $N_2$ are preferably halved of those for single N. It is still also allowable to use at least one substance selected from Ar, F and C in place of N or $N_2$.

The next step relates to ion implantation for forming the extension region.

Figure 9C:
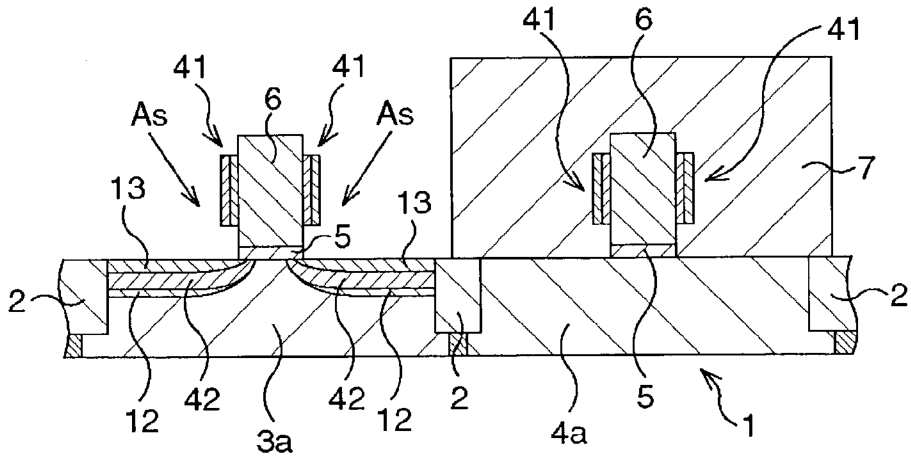

More specifically, as shown in FIG. 9C, an n-type impurity ion, which is arsenic (As) ion herein for example, is implanted in the n-type element active region 3 exposed out from the resist mask 7 under masking by the gate electrode 6, to thereby form a pair of extension regions 13 in the surficial portion of the semiconductor substrate 1 on both sides of the gate electrode 6. It is also preferable to use phosphorus (P) or antimony (Sb) in place of As. Conditions for the ion implantation relates to an ion acceleration energy of 1 keV to 5 keV, a dose of $1\times10^{14}/cm^2$ to $2\times10^{15}/cm^2$, and a tilt angle of 0° to 10°.

Figure 10A:
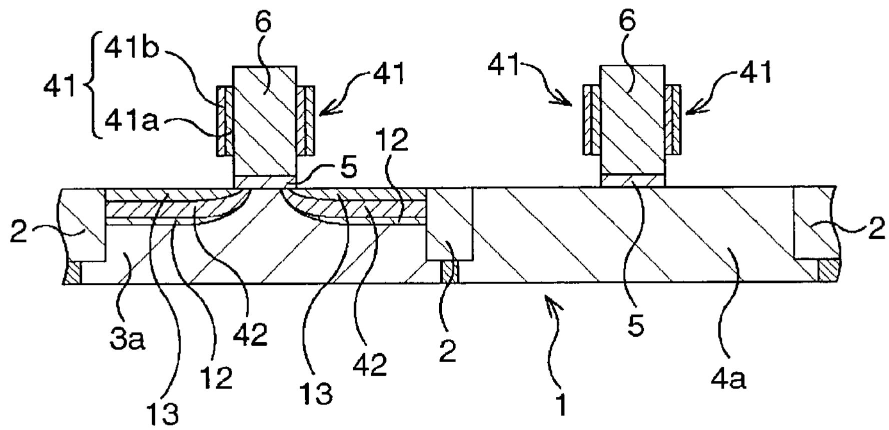
FIGS. 10A to 10C are schematic sectional views serially showing process steps as continued from FIG. 9C.
Figure 10B:
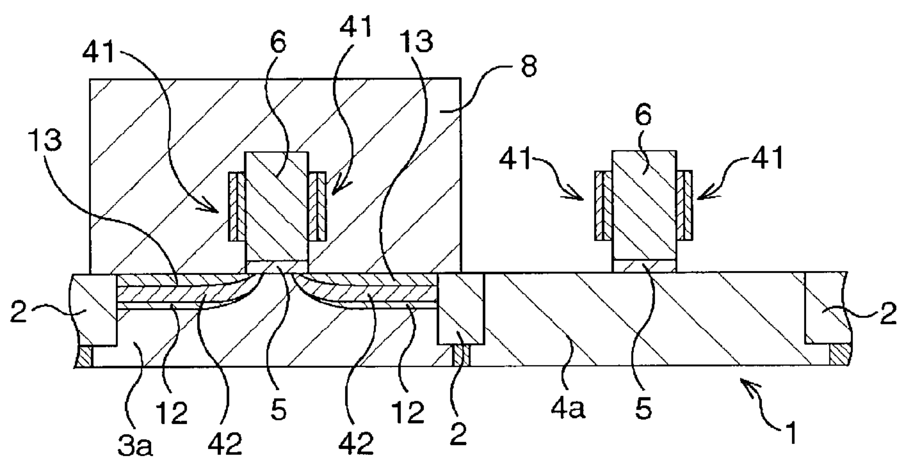

Next the resist mask 7 is removed as shown in FIG. 10A typically by ashing, a new photoresist is coated on the entire surface, and the coated film is patterned by photolithography to thereby form a resist mask 8 exposing, this time, only the p-type element active region 4 as shown in FIG. 10B.

Then ion implantation for forming the pocket region is carried out first.

Figure 10C:
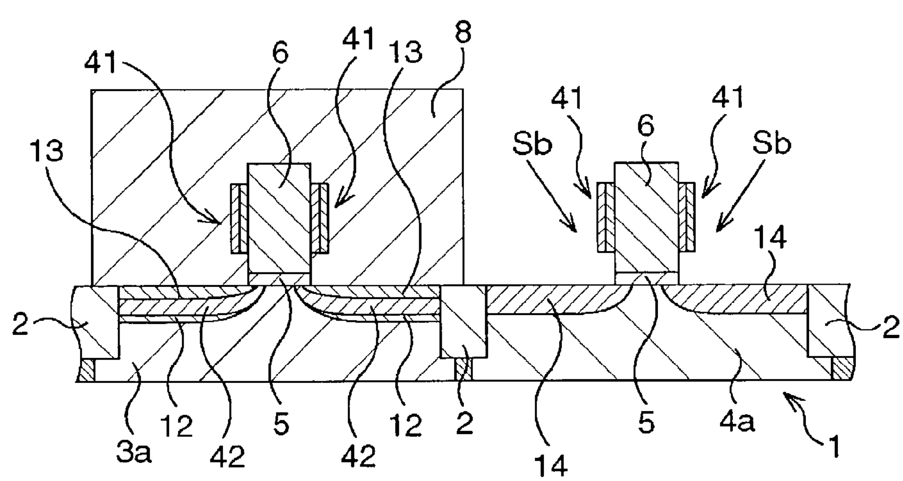

More specifically, as shown in FIG. 10C, an n-type impurity ion, which is antimony (Sb) ion herein for example, is implanted in the p-type element active region 4 exposed out from the resist mask 8 under masking by the gate electrode 6, to thereby form a pair of pocket regions 14 in the surficial portion of the semiconductor substrate 1 on both sides of the gate electrode 6.

Conditions for the ion implantation of Sb relates to an ion acceleration energy of 40 keV to 90 keV, a dose of $5\times10^{12}/cm^2$ to $2\times10^{13}/cm^2$, and a tilt angle of 0° to 45°. It is also allowable to use, in place of Sb, other n-type impurities such as As and P.

The next step relates to ion implantation for forming the extension region.

Figure 11A:
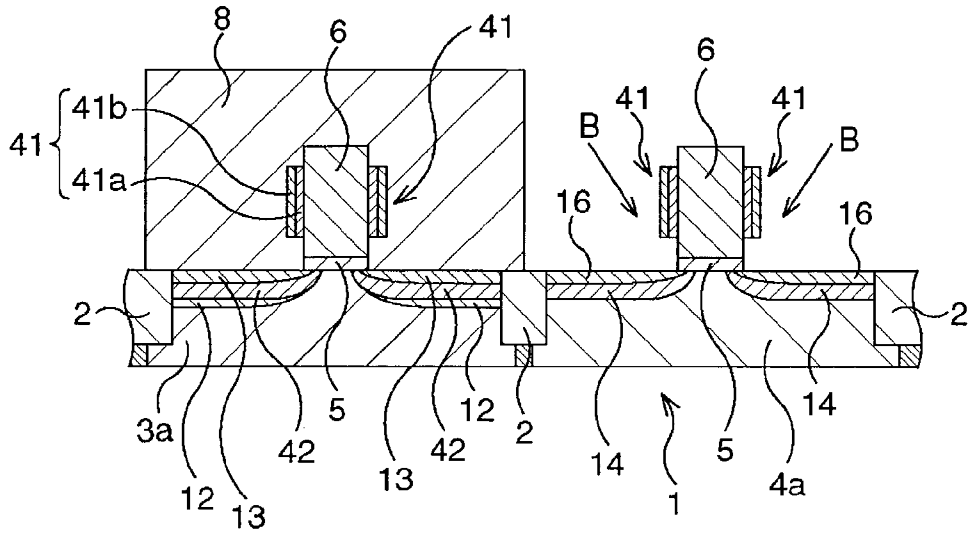
FIGS. 11A to 11C are schematic sectional views serially showing process steps as continued from FIG. 10C.

More specifically, as shown in FIG. 11A, a p-type impurity ion, which is boron (B) ion herein for example, is implanted in the p-type element active region 4 exposed out from the resist mask 8 under masking by the gate electrode 6, to thereby form a pair of extension regions 16 in the surficial portion of the semiconductor substrate 1 on both sides of the gate electrode 6.

Conditions for the ion implantation of B relate to an ion acceleration energy of 0.2 keV to 0.5 keV, a dose of $1\times10^{14}/cm^2$ to $2\times10^{15}/cm^2$, and a tilt angle of 0° to 10°. For the case where an ion species of $BF_2$ is used, the implantation can be optimized by setting the ion acceleration energy to 2.5 keV or below while the dose is remained unchanged. For the case where an ion species of $BF_2$ is used, the implantation can be optimized by setting the ion acceleration energy to 1 keV to 2.5 keV and the dose is doubled.

Next, a pair of deep source and drain regions (deep S/D regions) are formed respectively in the element active regions 3, 4.

Figure 11B:
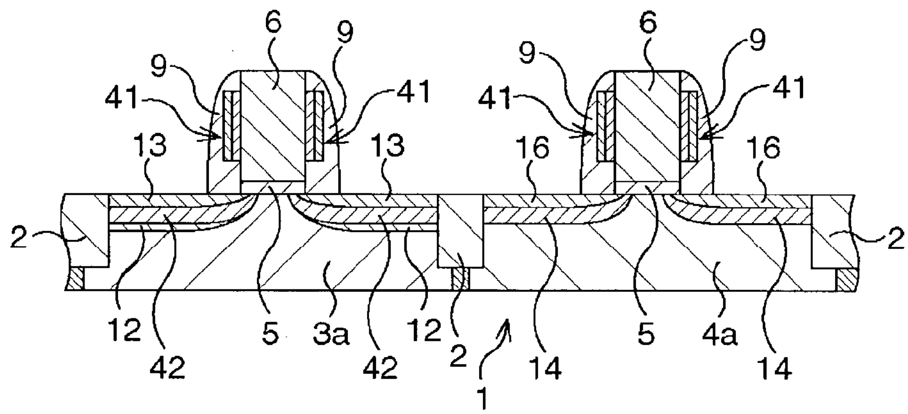

More specifically, the resist mask 8 is removed typically by ashing, a silicon oxide film is deposited typically by CVD process over the entire surface, and the silicon oxide film is then anisotropically etched (etched back) from the top so as to allow it to remain only on the side faces of the gate electrode 6, to thereby form sidewalls 9 covering the notch-formed spacers 41 as shown in FIG. 11B.

Figure 11C:
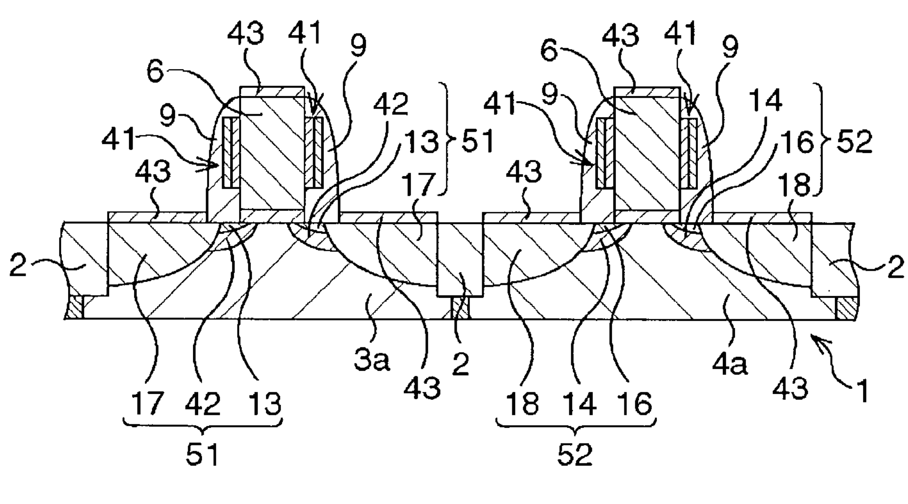

Next, a photoresist is coated on the entire surface, and is then processed by photolithography to thereby form a resist mask (not shown) exposing only the n-type element active region 3. Then an n-type impurity ion, which is phosphorus (P) ion herein for example, is implanted in the n-type element active region 3 exposed out from the resist mask under masking by the gate electrode 6 and sidewall 9 to thereby form a pair of deep S/D regions 17 in the surficial portion of the semiconductor substrate 1 on both sides of the gate electrode 6 as shown in FIG. 11C. Conditions for the ion implantation of P relate to an ion acceleration energy of 5 keV to 15 keV, a dose of $6\times10^{15}/cm^2$ to $1\times10^{16}/cm^2$, and a tilt angle of 0° to 10°. It is also allowable to use arsenic (As) in place of P.

The resist mask was then removed typically by ashing, a new photoresist is again coated on the entire surface, and is then processed by photolithography to thereby form another resist mask (not shown) exposing, this time, only the p-type element active region 4. Then a p-type impurity ion, which is boron (B) ion herein for example, is implanted in the p-type element active region 4 exposed out from the resist mask under masking by the gate electrode 6 and sidewall 9 to thereby form a pair of deep S/D regions 18 in the surficial portion of the semiconductor substrate 1 on both sides of the gate electrode 6. Conditions for the ion implantation of B relate to an ion acceleration energy of 3 keV to 6 keV, a dose of $2\times10^{15}/cm^2$ to $6\times10^{15}/cm^2$, and a tilt angle of 0° to 10°. Any ions containing B, such as $BF_2$, are available for the ion implantation.

The resist mask is then removed typically by ashing, and the individual impurities are then activated by rapid thermal annealing (RTA) at 1,000° C. to 1,050° C. for an extremely short time as close as 0 second in an $N_2$ atmosphere. By this annealing, the concentration profile of the implanted N changes from its as-implanted status, and a concentration profile finally achieved will be such that approximately overlapping the pocket region 42, and that having two concentration peaks in the vicinity of an interface with the semiconductor substrate 1 and at the A/C interface; and a pair of n-type impurity-diffused layers 51 comprising the pocket region 42, N-diffused region 12, extension region 13 and deep S/D region 17 is formed in the n-type element active region 3 are formed. It is to be noted that the above concentration profile may sometimes be formed before the RTA due to heat treatment following formation of the pocket region 42. On the other hand, the RTA also results in formation of a pair of p-type impurity-diffused layers 52 comprising the pocket region 14, extension region 16 and deep S/D region 18 in the p-type element active region 4.

The nMOS and pMOS transistors are then subjected to SALICIDE process. A metal layer for silicidation, which is cobalt (Co) film herein for example, is deposited on the entire surface, and is allowed to react with silicon in the gate electrode 6, n-type impurity-diffused layer 51 and p-type impurity-diffused layer 52, to thereby form CoSi films 43. Unreacted cobalt is removed.

The removal is further followed by individual formation processes of inter-layer insulating film, contact hole and various wirings, which completes an nMOS transistor in the n-type element active region 3, and a pMOS transistor in the p-type element active region 4.

Although the present embodiment described in the above dealt with the case where a pair of impurity-diffused layers, later completed as a source and a drain, were formed after the gate electrode was formed, the present invention is by no means limited thereto, and order of formation processes therefor may properly be altered.

In the second embodiment described in the above, the impurity-diffused layer 51 was formed by carrying out the ion implantation for forming the pocket region, N implantation aimed at suppressing diffusion, and ion implantation for forming the extension region in this order, the order of these processes is arbitrary and is not specifically limited. It is to be noted, however, that it is necessary to optimize the concentration profiles of the pocket region and/or extension region since some specific orders of the processes may affect the concentration profile due to effects of amorphization.

In general, nMOS transistor suffers from a problem that the pocket region formed by ion implantation of indium (In) tends to degrade the roll-off characteristic due to a low solubility limit of the element. On the other hand, the pocket region formed by additional ion implantation of boron (B) in addition to indium (In) desirably improves the roll-off characteristic but lowers current since boron piled up in the surficial portion of the substrate will be causative of scattering of electrons in the channel.

Figure 12:
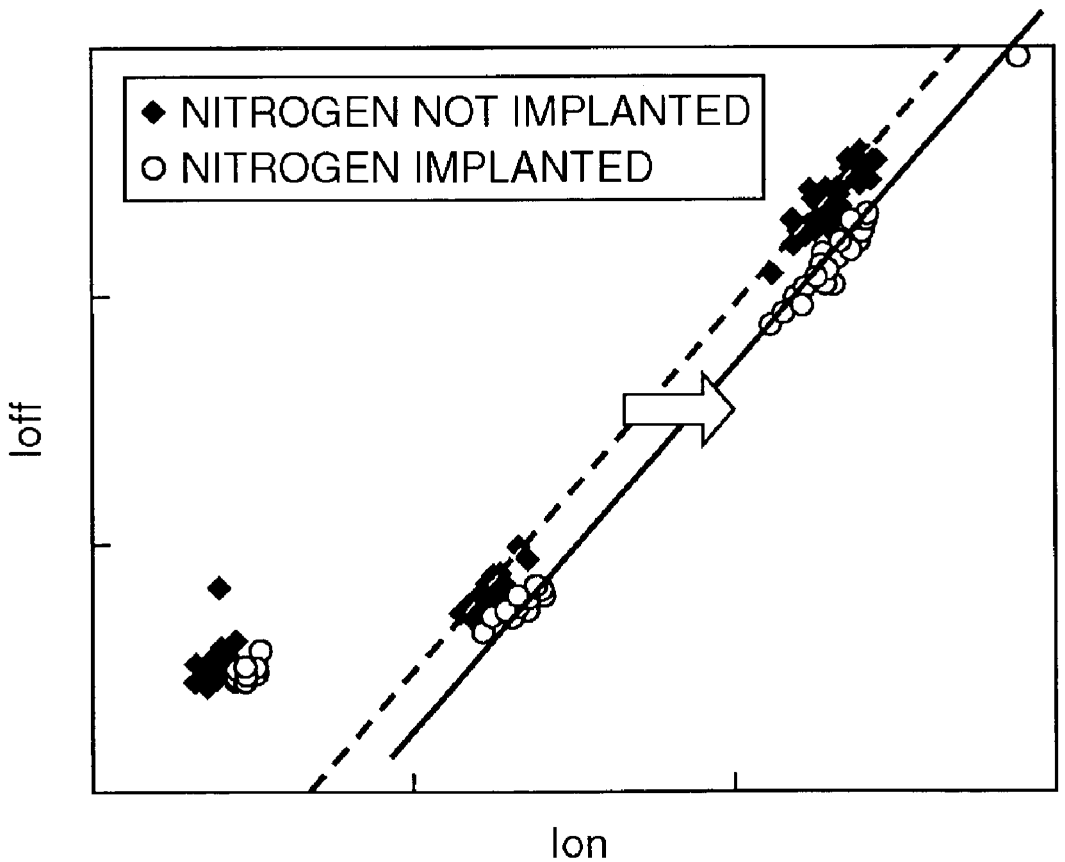
FIG. 12 is a characteristic chart showing results of examination on current characteristics (ON current ($I_{on}$) vs. OFF current ($I_{off}$) characteristics) affected by N implanted as a diffusion-suppressive substance in the second embodiment.

The present inventors examined current characteristics (ON current ($I_{on}$) vs. OFF current ($I_{off}$) characteristics) affected by N implanted as a diffusion-suppressive substance in the second embodiment. Results are shown in FIG. 12. As is clear from the graph, N implantation improves $I_{on}$-$I_{off}$ characteristic as compared with a case without N implantation. This means that introduction of N desirably prevented the impurity (boron) in the pocket region from being piled up in the surficial portion of the substrate, which reduced a causal factor for scattering of electrons in the channel, and prevented the current from being decreased. In short, both of the roll-off characteristic and $I_{on}$-$I_{off}$ characteristic can be improved according to the second embodiment, since indium (In) and boron (B) ions are implanted to form the pocket region of the nMOS transistor, and nitrogen is further introduced as a diffusion-suppressive substance.

As has been described in the above, the second embodiment ensures shrinkage and higher integration of the semiconductor device in a simple and exact manner without ruining an effort to improve roll-off characteristic of the threshold voltage and current drivability and to reduce drain leakage current; and can particularly ensures optimum design of CMOS transistor so as to realize advanced performance and lowered power consumption.

(Third Embodiment)

The third embodiment will disclose a method of fabricating a CMOS transistor similarly to the preceding first and second embodiment except for a style of N implantation. The constitutional members common with those described in the first embodiment will be denoted using the same reference numerals without detailed explanation. While the third embodiment will be described in conjunction with the first embodiment, it is also allowable to apply the third embodiment to the second embodiment, that is to carry out N implantation twice.

Figure 13A:
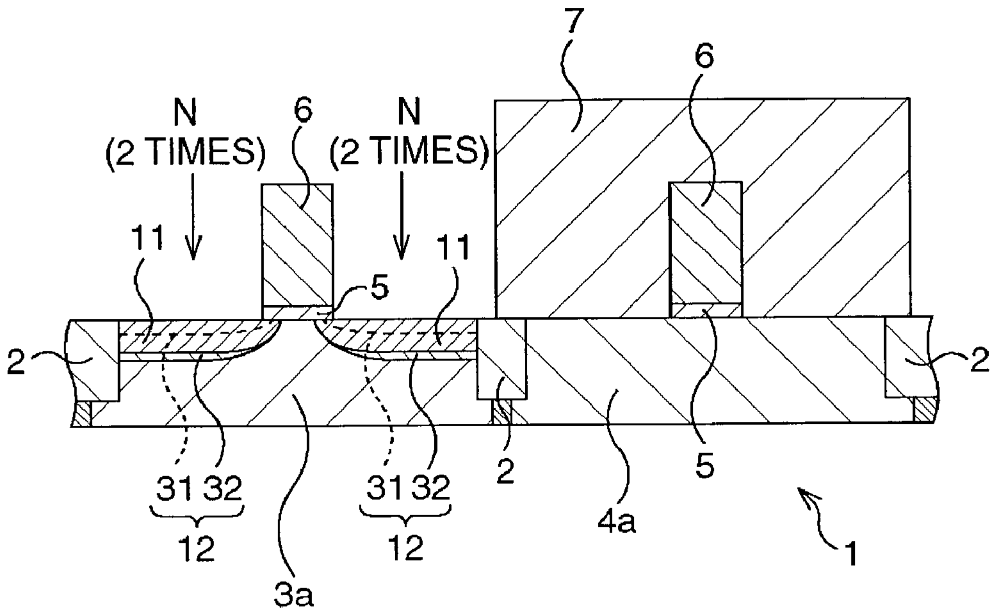
FIGS. 13A and 13B are schematic sectional views specifically showing N implantation in a method of fabricating a CMOS transistor according to a third embodiment.
Figure 13B:
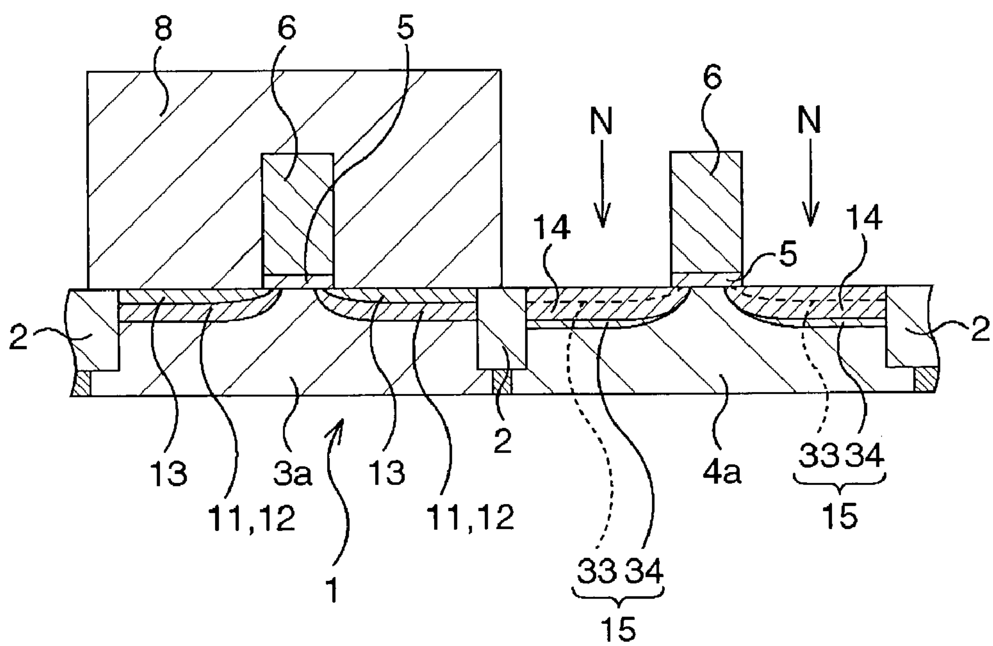

FIGS. 13A and 13B are schematic sectional views specifically showing only N implantation in a method of fabricating a CMOS transistor.

In the third embodiment, the ion implantation for forming the pocket region 11 of the nMOS transistor are first carried out according to the steps shown in FIGS. 1A through 1C similarly as described in the first embodiment, and then N implantation is repeated twice as shown in FIG. 13A.

More specifically, a diffusion-suppressive substance, which is N herein for example, is implanted in the n-type element active region 3 exposed out from the resist mask 7 so as to target a shallow portion of the semiconductor substrate 1 in the vicinity of the interface with the gate insulating film, under masking by the gate electrode 6, to thereby form a pair of shallow N-diffused regions 31 on both sides of the gate electrode 6. Conditions for the ion implantation relates to an ion acceleration energy of 2 keV or around, a dose of $1\times10^{14}/cm^2$ to $2\times10^{15}/cm^2$, and a tilt angle of 0° to 10°.

Next, a diffusion-suppressive substance, which is again N for example, is implanted for the second time in the n-type element active region 3 exposed out from the resist mask 7 so as to target a deep portion of the semiconductor substrate 1, which is equivalent to the ion implantation for forming the pocket region 11, under masking by the gate electrode 6, to thereby form a pair of deep N-diffused regions 32 on both sides of the gate electrode 6. The shallow N-diffused regions 31 and deep N-diffused regions 32 compose a pair of N-diffused regions 12. Conditions for the ion implantation relates to an ion acceleration energy of 10 keV to 20 keV, a dose of $1\times10^{14}/cm^2$ to $2\times10^{15}/cm^2$, and a tilt angle of 0° to 10°.

Ion implantation for forming a pair of extension regions 13 of the nMOS transistor is then carried out, another ion implantation for forming a pair of pocket regions 15 of the pMOS transistor was carried out according to the steps shown in FIGS. 2C, 3A and 3B, and then N implantation is repeated twice as shown in FIG. 13B.

More specifically, a diffusion-suppressive substance, which is N herein for example, is implanted in the p-type element active region 4 exposed out from the resist mask 8 so as to target a shallow portion of the semiconductor substrate 1 in the vicinity of the interface with the gate insulating film, under masking by the gate electrode 6, to thereby form a pair of shallow N-diffused regions 33 on both sides of the gate electrode 6. Conditions for the ion implantation relates to an ion acceleration energy of 2 keV or around, a dose of $1\times10^{14}/cm^2$ to $2\times10^{15}/cm^2$, and a tilt angle of 0° to 10°.

Next, a diffusion-suppressive substance, which is again N for example, is implanted for the second time in the p-type element active region 4 exposed out from the resist mask 8 so as to target a deep portion of the semiconductor substrate 1, which is equivalent to the ion implantation for forming the pocket region 14, under masking by the gate electrode 6, to thereby form a pair of deep N-diffused regions 34 on both sides of the gate electrode 6. The shallow N-diffused regions 33 and deep N-diffused regions 34 compose a pair of N-diffused regions 15. Conditions for the ion implantation relates to an ion acceleration energy of 10 keV to 20 keV, a dose of $1\times10^{14}/cm^2$ to $2\times10^{15}/cm^2$, and a tilt angle of 0° to 10°.

The implantation is further followed by individual process steps shown in FIGS. 4A through 4C and related post-processes, which completes an nMOS transistor in the n-type element active region 3, and a pMOS transistor in the p-type element active region 4.

As has been described in the above, the third embodiment ensures shrinkage and higher integration of the semiconductor device in a simple and exact manner without ruining an effort to improve roll-off characteristic of the threshold voltage and current drivability and to reduce drain leakage current; and can particularly ensures optimum design of CMOS transistor so as to realize advanced performance and lowered power consumption. In addition, the N implantation repeated twice corresponding to the individual concentration peaks will be more successful in obtaining the above-described effects.

(Fourth Embodiment)

The fourth embodiment will specifically disclose a method of fabricating a CMOS transistor in which different species of diffusion-suppressive substances are used for the nMOS transistor and pMOS transistor.

FIGS. 14A to 17C are schematic sectional views sequentially showing process steps for fabricating the CMOS transistor according to the fourth embodiment.

Figure 14A:
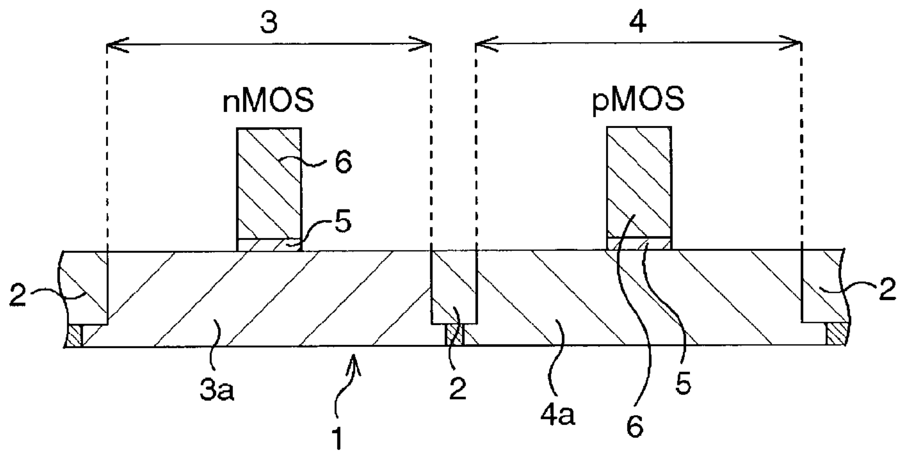
FIGS. 14A to 14C are schematic sectional views serially showing process steps of a method of fabricating a CMOS transistor according to a fourth embodiment.

First, as shown in FIG. 14A, element active regions and gate electrodes are formed according to general CMOS processes.

More specifically, according to the STI (shallow trench isolation) process, trenches are formed by photolithography and dry etching in a semiconductor substrate 1 in the areas planned for forming element isolation region, a silicon oxide film is deposited typically by CVD process so as to fill the trenches, and the silicon oxide film is removed by CMP (chemical mechanical polishing) from the top so as to allow it to remain only in the trenches, to thereby form STI-type element isolation structure 2 and partition an n-type element active region 3 and a p-type element active region 4. Next, a p-type impurity and an n-type impurity are introduced by ion implantation into the n-type element active region 3 and p-type element active region 4, respectively, to thereby form a p-well 3*a* and an n-well 4*a*, respectively. In this example, the n-type element active region 3 serves as an area for forming an nMOS transistor, and the p-type element active region 4 serves as an area for forming a pMOS transistor.

Next, a gate insulating film 5 is formed by thermal oxidation over the element active regions 3, 4, a polysilicon film is then deposited thereon typically by CVD process, and the polysilicon film and gate insulating film 5 are then patterned in a form of electrode by photolithography and dry etching to thereby form gate electrodes 6 respectively in the element active regions 3, 4 while being underlain by the gate insulating film 5.

Figure 14B:
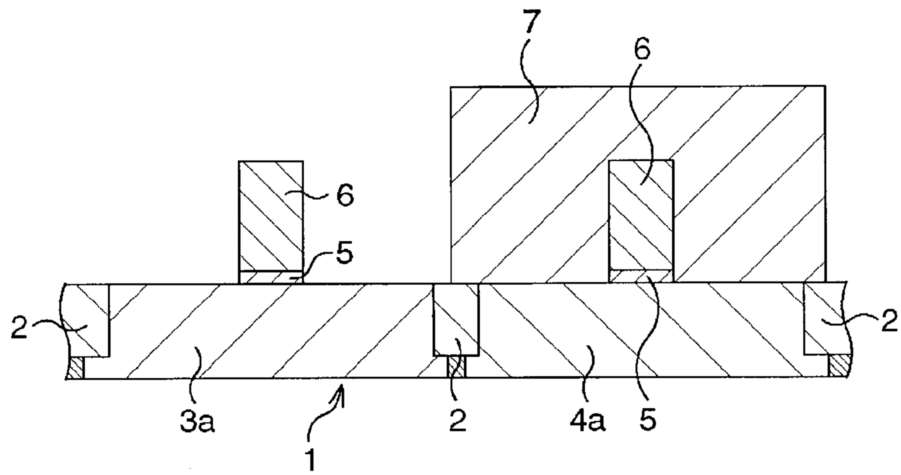

Next, a photoresist is coated on the entire surface, and is then processed by photolithography to thereby form a resist mask 7 which exposes only the n-type element active region 3 as shown in FIG. 14B.

Only the n-type element active region 3 is then subjected to ion implantation for forming a pair of pocket regions.

Figure 14C:
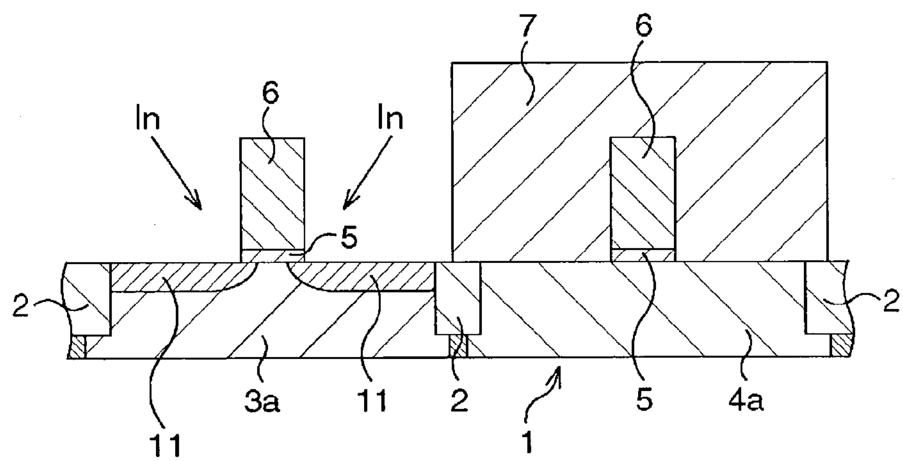

More specifically, as shown in FIG. 14C, a p-type impurity ion, which is indium (In) ion herein for example, is implanted in the n-type element active region 3 exposed out from the resist mask 7 under masking by the gate electrode 6, to thereby form a pair of pocket regions 11 in the surficial portion of the semiconductor substrate 1 on both sides of the gate electrode 6.

Conditions for the ion implantation of In relates to an ion acceleration energy of 30 keV to 100 keV, and a dose of $5\times10^{12}/cm^2$ to $2\times10^{13}/cm^2$, where the ion is implanted along a direction inclined away from the direction normal to the surface of the semiconductor substrate 1. Angle of the inclination (tilt angle) is set to 0° to 45°, where 0° represents the direction of the normal line on the semiconductor substrate 1. In this embodiment, the ion is implanted into the surficial portion of the substrate at the foregoing ion acceleration energy and dose from four directions symmetrical with each other. It is to be noted now that all implantations employing the tilt angle are always carried out along four directions although not specifically noted hereinafter. It is also allowable to use boron (B) in place of In, where the ion acceleration energy is set to 3 keV to 10 keV.

Next, nitrogen (N) is introduced as a diffusion-suppressive substance.

Figure 15A:
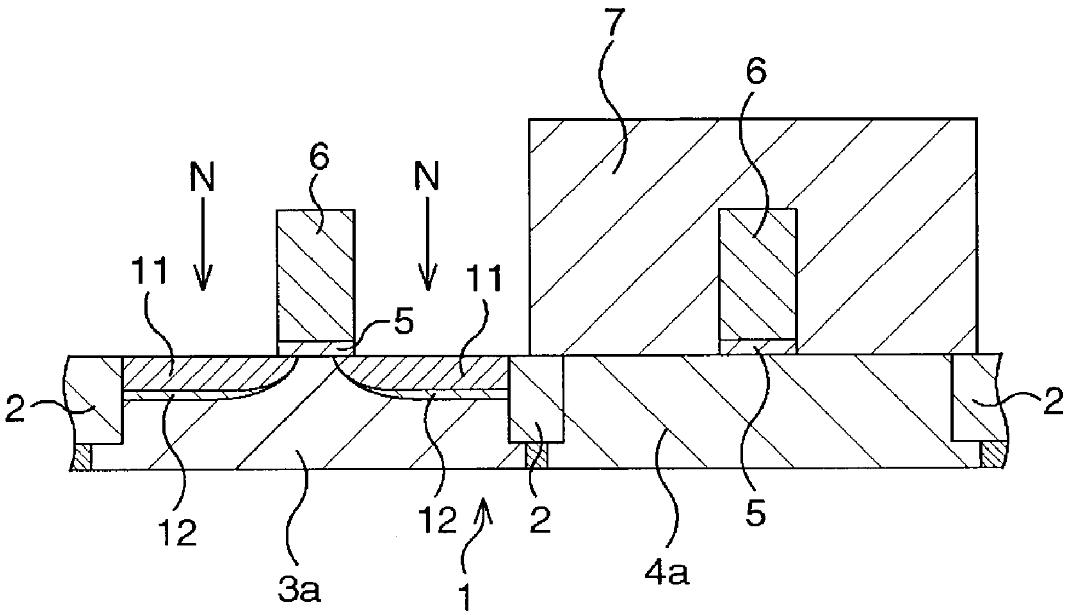
FIGS. 15A and 15B are schematic sectional views serially showing process steps as continued from FIG. 14C.

More specifically, as shown in FIG. 15A, a diffusion-suppressive substance, which is N herein for example, is implanted in the n-type element active region 3 exposed out from the resist mask 7, under masking by the gate electrode 6, to thereby form a pair of N-diffused regions 12 in the surficial portion of the semiconductor substrate 1 on both sides of the gate electrode 6 so as to approximately overlap the pocket regions 11. Conditions for the ion implantation relates to an ion acceleration energy of 5 keV to 10 keV (major conditions for ensuring close overlapping with the pocket regions 11), a dose of $1\times10^{14}/cm^2$ to $2\times10^{15}/cm^2$, and a tilt angle of 0° to 10°. Diffusion-suppressive effect increases as the dose of N is increased from $1\times10^{14}/cm^2$, and shows a saturating tendency at $2\times10^{15}/cm^2$ or above. It is also allowable to use $N_2$ in place of single N, since it is relatively difficult for single N to ensure a sufficient level of implantation beam current. The ion acceleration energy and dose for $N_2$ are appropriately halved of those for single N.

The next step relates to ion implantation for forming the extension region.

Figure 15B:
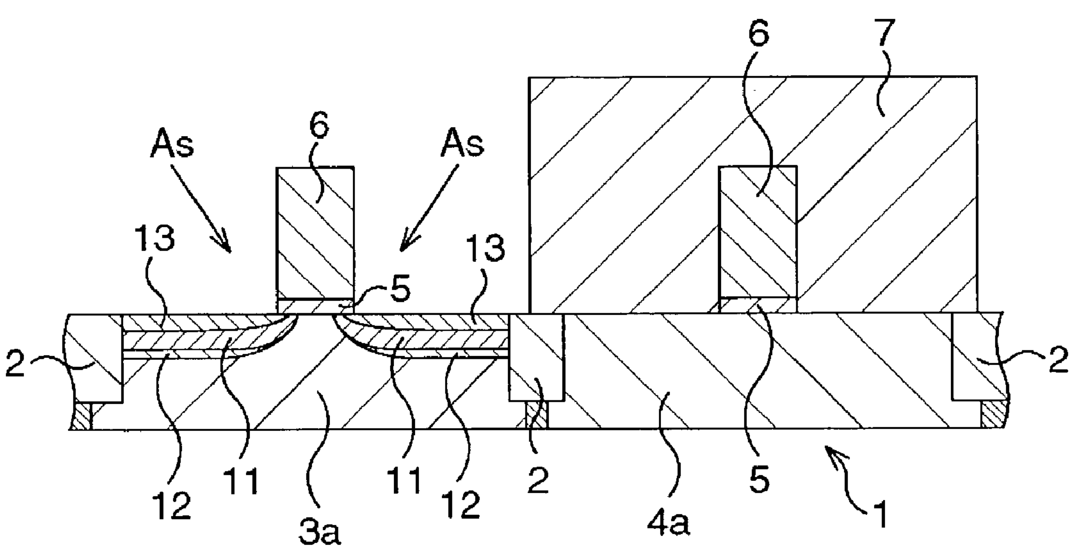

More specifically, as shown in FIG. 15B, an n-type impurity ion, which is arsenic (As) ion herein for example, is implanted in the n-type element active region 3 exposed out from the resist mask 7 under masking by the gate electrode 6, to thereby form a pair of extension regions 13 in the surficial portion of the semiconductor substrate 1 on both sides of the gate electrode 6. It is also preferable to use phosphorus (P) or antimony (Sb) in place of As. Conditions for the As ion implantation relates to an ion acceleration energy of 1 keV to 5 keV, a dose of $1\times10^{14}/cm^2$ to $2\times10^{15}/cm^2$, and a tilt angle of 0° to 10°.

Although the above description dealt with the case where the individual ion implantations were carried out under masking by the gate electrode 6 having no sidewalls formed on the side faces thereof, it is also allowable, as shown in FIG. 5, to carry out the above ion implantations under masking by the gate electrode 6 having on both side faces thereof thin sidewalls 10 of approx. 5 nm to 20 nm thick in order to optimize the overlap between the extension region and gate electrode 6. It is still also allowable to form the sidewall on only either of the gate electrodes 6 in the element activation regions 3, 4. There are no special limitations on film constitution and shape of the sidewall so far as it can properly function as a spacer (mask).

The diffusion-suppressive effect is enhanced as the dose of N increases from $1\times10^{14}/cm^2$, and shows a saturating tendency at $2\times10^{15}/cm^2$ or above as described in the above, where optimum conditions therefor will vary depending on the presence or absence of the sidewall and the thickness thereof. Under the presence of the sidewall, the ion implantation for forming the pocket region must be optimized so as to raise the energy, and that for forming the extension region must be optimized so as to raise the dose to a certain extent.

While the implantation of the diffusion-suppressive substance was carried out after the resist mask 7 was formed in the process described in the present embodiment, the implantation may precede the formation of the resist mask 7 while targeting the entire area of the element active regions 3, 4. The implantation following the formation of the resist mask 7 as described in the present embodiment is, however, advantageous because conditions for the implantation can be optimized independently for the nMOS and pMOS transistors.

Figure 16A:
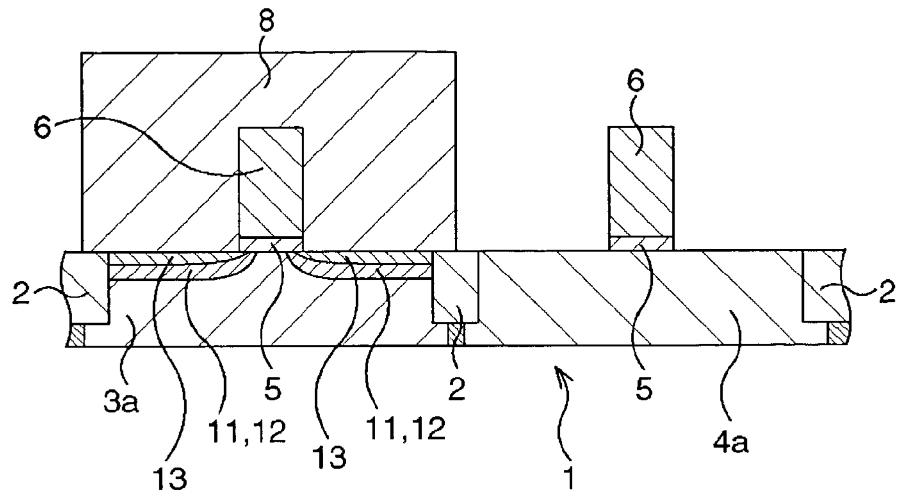
FIGS. 16A to 16C are schematic sectional views serially showing process steps as continued from FIG. 15C.

Next, a photoresist is coated on the entire surface, and is then processed by photolithography to thereby form a resist mask 8 exposing, this time, only the p-type element active region 4 as shown in FIG. 16A.

First, ion implantation for forming the pocket region is carried out.

Figure 16B:
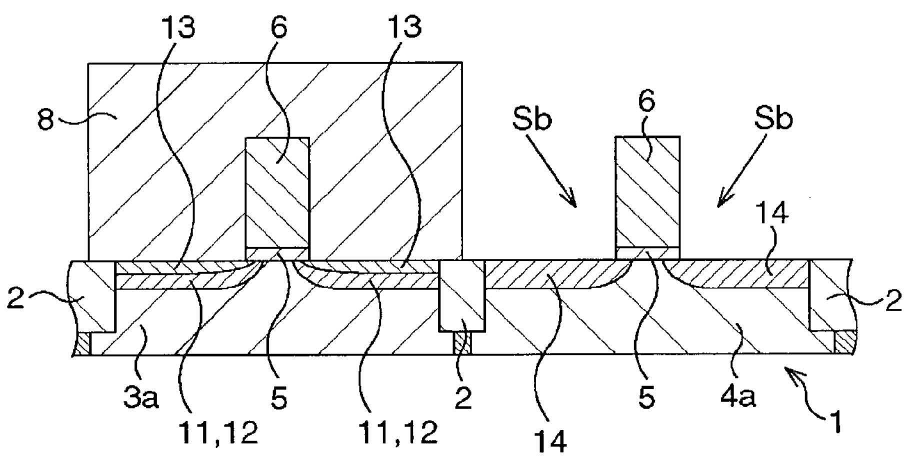

More specifically, as shown in FIG. 16B, an n-type impurity ion, which is antimony (Sb) ion herein for example, is implanted in the p-type element active region 4 exposed out from the resist mask 8 under masking by the gate electrode 6, to thereby form a pair of pocket regions 14 in the surficial portion of the semiconductor substrate 1 on both sides of the gate electrode 6.

Conditions for the ion implantation of Sb relates to an ion acceleration energy of 40 keV to 90 keV, a dose of $5\times10^{12}/cm^2$ to $2\times10^{13}/cm^2$, and a tilt angle of 0° to 45°. It is also allowable to use, in place of Sb, other n-type impurities such as As and P.

Next, fluorine (F) is introduced as a diffusion-suppressive substance.

Figure 16C:
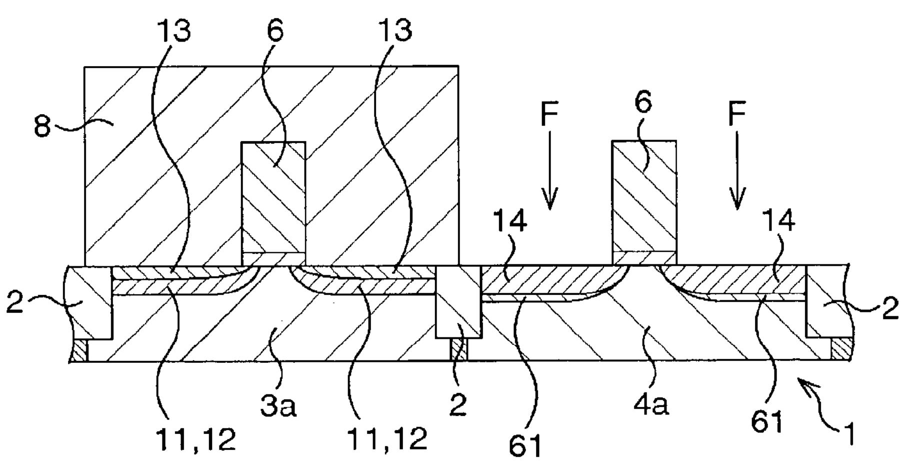

More specifically, as shown in FIG. 16C, a diffusion-suppressive substance, which is F herein for example, is implanted in the p-type element active region 4 exposed out from the resist mask 8 under masking by the gate electrode 6, to thereby form a pair of F-diffused regions 61 in the surficial portion of the semiconductor substrate 1 on both sides of the gate electrode 6 so as to approximately overlap the pocket regions 14. Conditions for the ion implantation relates to an ion acceleration energy of 0.1 keV to 10 keV (major conditions for ensuring close overlapping with the pocket regions 14), a dose of $1\times10^{14}/cm^2$ to $2\times10^{15}/cm^2$, and a tilt angle of 0° to 10°.

The next step relates to ion implantation for forming the extension region.

Figure 17A:
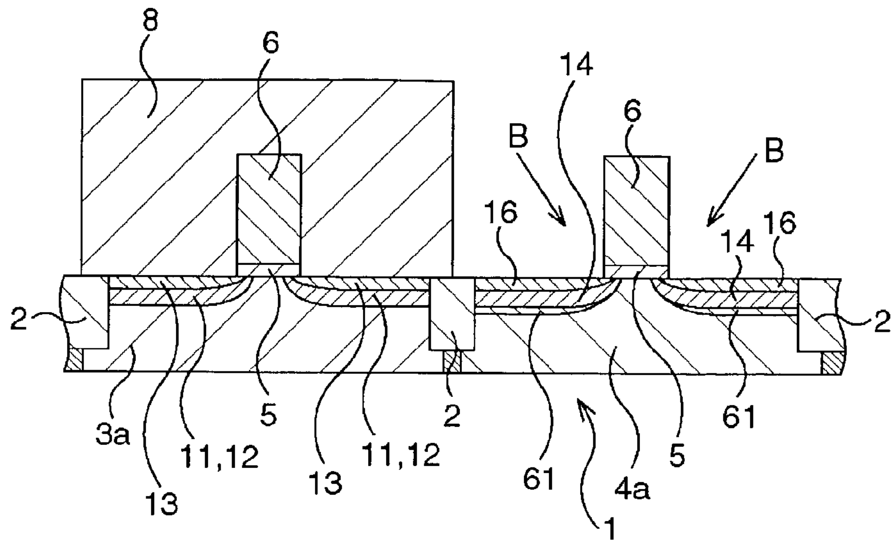
FIGS. 17A to 17C are schematic sectional views serially showing process steps as continued from FIG. 16C.

More specifically, as shown in FIG. 17A, a p-type impurity ion, which is boron (B) ion herein for example, is implanted in the p-type element active region 4 exposed out from the resist mask 8 under masking by the gate electrode 6, to thereby form a pair of extension regions 16 in the surficial portion of the semiconductor substrate 1 on both sides of the gate electrode 6.

Conditions for the ion implantation of B relate to an ion acceleration energy of 0.2 keV to 0.5 keV, a dose of $1\times10^{14}/cm^2$ to $2\times10^{15}/cm^2$, and a tilt angle of 0° to 10°. For the case where an ion species of $BF_2$ is used, the implantation can be optimized by setting the ion acceleration energy to 1 keV to 2.5 keV and by doubling the dose. The optimum conditions will vary depending on the presence or absence of the sidewall and the thickness thereof. Under the presence of the sidewall, the ion implantation for forming the pocket region must be optimized so as to raise the energy, and that for forming the extension region must be optimized so as to raise the dose to a certain extent.

Next, a pair of deep source-and-drain regions (deep S/D regions) are formed respectively in the element active regions 3, 4.

Figure 17B:
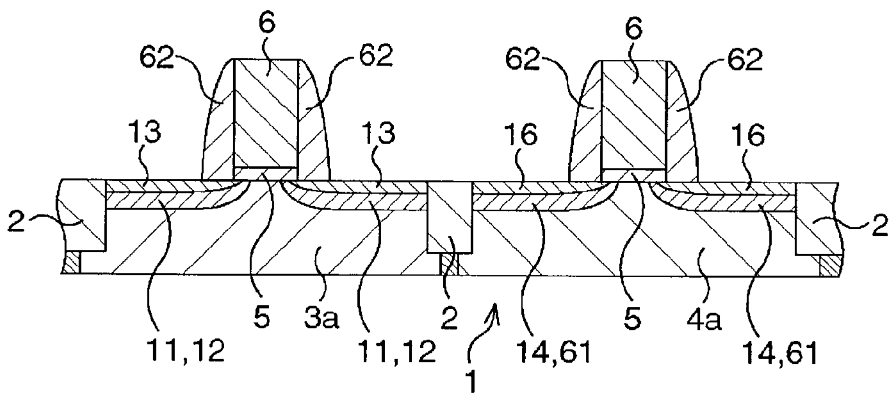

More specifically, the resist mask 8 is removed typically by ashing, a silicon oxide film is deposited typically by CVD process over the entire surface, and the silicon oxide film is then anisotropically etched (etched back) from the top so as to allow it to remain only on the side faces of the gate electrode 6, to thereby form sidewalls 62 as shown in FIG. 17B. Temperature for forming the sidewalls 62 are kept from 300° C. to 600° C. throughout the formation process. The silicon oxide film is significantly degraded at temperatures below 300° C., and fluctuations occur in the impurity profile at temperatures exceeding 600° C.

Figure 17C:
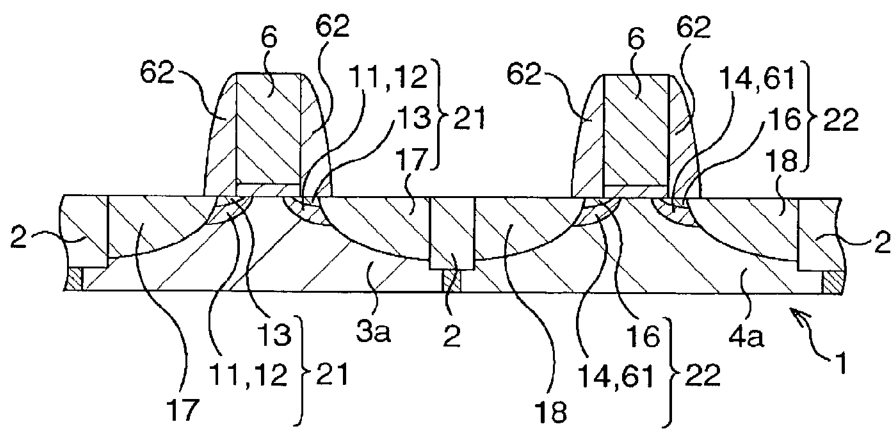

Next, a photoresist is coated on the entire surface, and is then processed by photolithography to thereby form a resist mask (not shown) exposing only the n-type element active region 3. Then an n-type impurity ion, which is phosphorus (P) ion herein for example, is implanted in the n-type element active region 3 exposed out from the resist mask under masking by the gate electrode 6 and sidewalls 62 to thereby form a pair of deep S/D regions 17 in the surficial portion of the semiconductor substrate 1 on both sides of the gate electrode 6 as shown in FIG. 17C. Conditions for the ion implantation of P relate to an ion acceleration energy of 5 keV to 20 keV, a dose of $2\times10^{15}/cm^2$ to $1\times10^{16}/cm^2$, and a tilt angle of 0° to 10°. It is also allowable to use arsenic (As) in place of P.

The resist mask is then removed typically by ashing, a new photoresist is again coated on the entire surface, and is then processed by photolithography to thereby form another resist mask (not shown) exposing, this time, only the p-type element active region 4. Then a p-type impurity ion, which is boron (B) ion herein for example, is implanted in the p-type element active region 4 exposed out from the resist mask under masking by the gate electrode 6 and sidewalls 62 to thereby form a pair of deep S/D regions 18 in the surficial portion of the semiconductor substrate 1 on both sides of the gate electrode 6. Conditions for the ion implantation of B relate to an ion acceleration energy of 2 keV to 5 keV, a dose of $2\times10^{15}/cm^2$ to $1\times10^{16}/cm^2$, and a tilt angle of 0° to 10°. Any ions containing B, such as $BF_2$, are available for the B ion implantation.

The individual impurities are then activated by rapid thermal annealing (RTA) at 1,000° C. to 1,050° C. instantaneously as close as 0 second. By this annealing, a pair of n-type impurity-diffused layers 21 comprising the pocket region 11, N-diffused region 12, extension region 13 and deep S/D region 17 is formed in the n-type element active region 3, and a pair of p-type impurity-diffused layers 22 comprising the pocket region 14, F-diffused layer 61, extension region 16 and deep S/D region 18 is formed in the p-type element active region 4.

The annealing is further followed by individual formation processes of inter-layer insulating film, contact holes and various wirings, and this completes an nMOS transistor in the n-type element active region 3, and a pMOS transistor in the p-type element active region 4.

Although the present embodiment described in the above dealt with the case where a pair of impurity-diffused layers, later completed as a source and a drain, were formed after the gate electrode was formed, the present invention is by no means limited thereto, and order of formation processes therefor may properly be altered.

In the present embodiment described in the above, the impurity-diffused layer 21 was formed by carrying out the ion implantation for forming the pocket region, N implantation aimed at diffusion suppression, and ion implantation for forming the extension region in this order. On the other hand, the impurity-diffused layer 22 was formed by carrying out the ion implantation for forming the pocket region, F implantation aimed at diffusion suppression, and ion implantation for forming the extension region in this order. The order of these processes is, however, arbitrary and is not specifically limited. It is to be noted, however, that it is necessary to optimize the concentration profiles of the pocket region and/or extension region since some specific orders of the processes may affect the concentration profile due to effects of amorphization.

As has been described in the above, the present embodiment ensures shrinkage and higher integration of the semiconductor device in a simple and exact manner without ruining efforts to improve roll-off characteristic of the threshold voltage and current drivability and to reduce drain leakage current; and can particularly ensures optimum design of CMOS transistor so as to realize advanced performance and lowered power consumption.

The present embodiment is also advantageous in realizing an nMOS transistor having a finer gate length without degrading the drive current, by forming the sidewalls 62 under a temperature condition of 600° C. or below, which ensures suppression of heat history of the processes up to the impurity activation as low as at 600° C. or below, to thereby omit the annealing for activating indium (In) implanted in the process of forming the pocket region 11 of the nMOS transistor, and by succeedingly introducing nitrogen (N) by ion implantation as a diffusion-suppressive substance into the n-type element active region 3.

The present embodiment is still also advantageous in realizing a pMOS transistor having a finer gate length without degrading the drive current, by introducing fluorine (F) by ion implantation as a diffusion-suppressive substance into the p-type element active region 4 of the pMOS transistor, unlike the case for the nMOS transistor.

The next paragraphs will explain results of investigations into the individual transistor characteristics of the nMOS transistor and pMOS transistor composing the CMOS transistor obtained in the first through fourth embodiments described in the above, based on comparison between the cases with and without implantation of the diffusion-suppressive substance.

Figure 18:
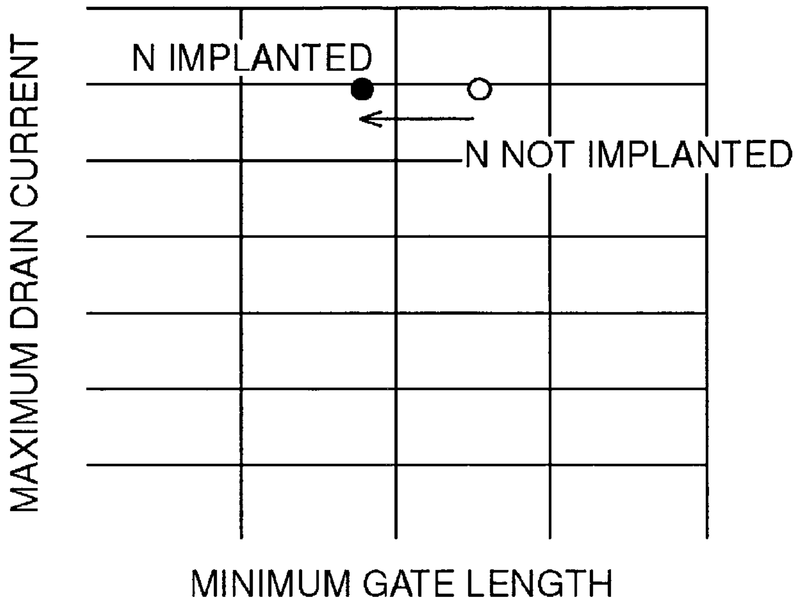
FIG. 18 is a characteristic chart showing transistor characteristics of the nMOS transistor.

Results of the investigation on the nMOS transistor are shown in FIG. 18. The figure illustrates relations between minimum gate length, which is defined as a gate length giving an off-state current of 70 mA/μm or below, and maximum drain current, where the abscissa (gate length) is graduated in 5 nm, and the ordinate (maximum drain current) in 0.1 mA/μm. The plot ● represents the cases with the N ion implantation (corresponded to the first through fourth embodiments), and the plot ○ represents the case without the N ion implantation (corresponded to the comparative example). It was found from the drawing that the minimum gate length of the nMOS transistor was successfully reduced and that excellent transistor characteristics were obtained by the N ion implantation while causing almost no degradation of the maximum drain current.

Figure 19:
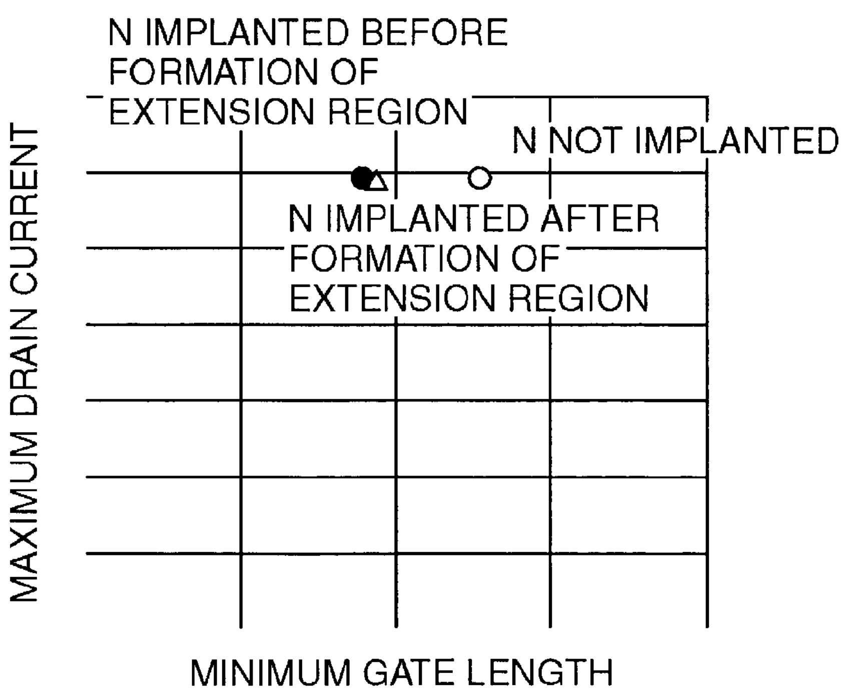
FIG. 19 is a characteristic chart showing transistor characteristics of the nMOS transistor.

FIG. 19 shows results of the investigations by which whether the order of the implantation of the diffusion-suppressive substance and the implantation of the impurity for forming the extension region affects the transistor characteristics or not was examined.

The plot ● represents the cases where N ion was implanted before the impurity implantation for forming the extension region (corresponded to the first through fourth embodiments), the plot Δ represents the case where N ion was implanted after the impurity implantation for forming the extension region, and the plot ○ represents the case without the N ion implantation (comparative example). As is clear from the drawing, no distinct difference was observed between the results irrespective of the order of the N ion implantation and the impurity implantation for forming the extension region, and both cases were found to result in excellent transistor characteristics.

Figure 20:
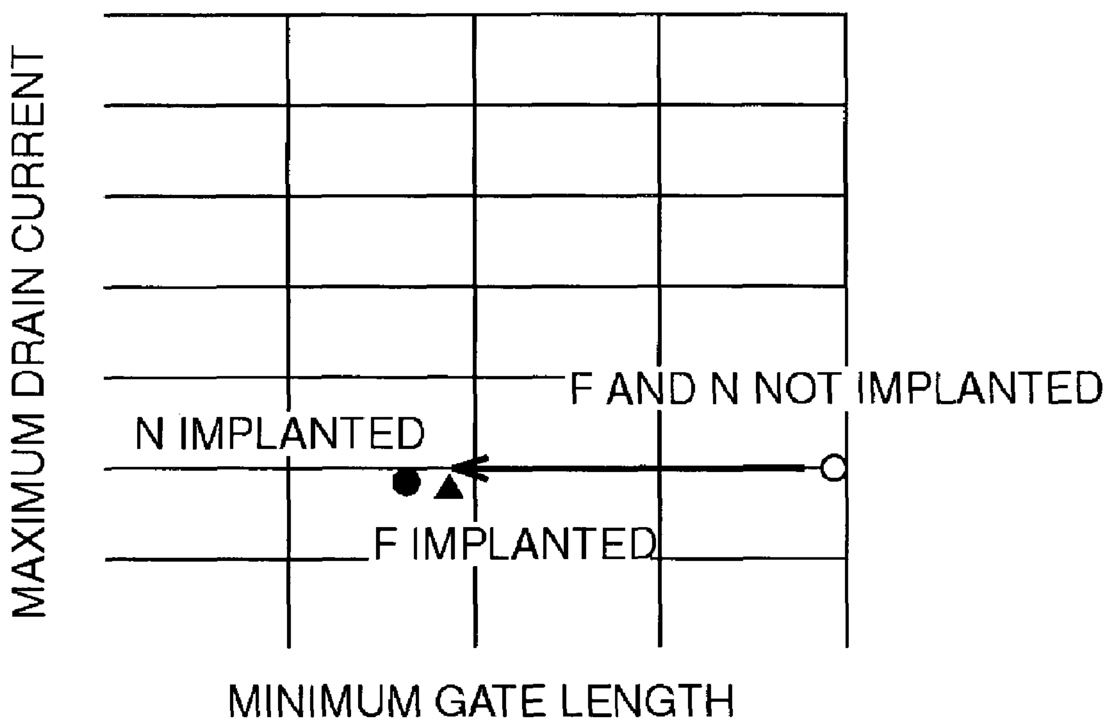
FIG. 20 is a characteristic chart showing transistor characteristics of the pMOS transistor.

FIG. 20 shows results of the investigations on the pMOS transistor.

The plot ● represents the case with the N ion implantation (corresponded to the first embodiment), the plot ▲ represents the case with the F ion implantation (corresponded to the fourth embodiment), and the plot ○ represents the case without the N ion implantation (comparative example). It was found from the drawing that the pMOS transistor was successfully reduced in the minimum gate length, and that excellent transistor characteristics were obtained by the N ion implantation or the F ion implantation while causing almost no degradation of the maximum drain current.

What is claimed is:

1. A semiconductor device comprising:

a semiconductor substrate;

a gate electrode formed over said semiconductor substrate while placing a gate insulating film in between;

a pair of impurity-diffused layers formed in the surficial portion of said semiconductor substrate on both sides of said gate electrode;

each of said impurity-diffused layers comprising:

a shallow first region partially overlapping the bottom portion of said gate electrode;

a second region being deeper than said first region and overlapping said first region; and a third region having introduced therein a diffusion-suppressive substance for suppressing diffusion of an impurity contained in said first region so as to have concentration peaks at least at a first position in the vicinity of the interface between a constitutional member composed of said gate electrode and said gate insulating film and said semiconductor substrate and at a second position deeper than said first region.

2. The semiconductor device according to claim 1, wherein said impurity-diffused layer further comprises a fourth region having introduced therein at least one impurity having a conductivity type opposite to that of impurities contained in said first and second regions; and said third region has a concentration profile almost equivalent to that of said fourth region but has a higher concentration as compared therewith at least over a partial range of depth.

3. The semiconductor device according to claim 1, wherein said concentration peak at said first position is larger than that at said second position.

4. The semiconductor device according to claim 2, wherein said concentration peak at said first position is larger than that at said second position.

5. The semiconductor device according to claim 1, wherein said diffusion-suppressive substance is at least any one selected from nitrogen, argon, fluorine and carbon.

6. The semiconductor device according to claim 1, wherein said semiconductor device is a CMOS-type semiconductor device, and at least either of nMOS transistor and pMOS transistor thereof has a pair of said impurity-diffused layers.

7. The semiconductor device according to claim 2, wherein said semiconductor device has at least an nMOS transistor, said nMOS transistor having a pair of said impurity-diffused layers; and said fourth region has introduced therein indium and boron as said impurities having an opposite conductivity type.

* * * * *